(12) United States Patent
Choi et al.

(10) Patent No.: US 11,963,408 B2
(45) Date of Patent: Apr. 16, 2024

(54) DISPLAY APPARATUS

(71) Applicant: SAMSUNG DISPLAY CO., LTD., Yongin-si (KR)

(72) Inventors: Wonwoo Choi, Yongin-si (KR); Inbae Kim, Yongin-si (KR); Changok Kim, Yongin-si (KR); Donghun Nam, Yongin-si (KR); Jinseock Kim, Yongin-si (KR); Hyuntae Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 315 days.

(21) Appl. No.: 17/462,390

(22) Filed: Aug. 31, 2021

(65) Prior Publication Data

US 2022/0238623 A1 Jul. 28, 2022

(30) Foreign Application Priority Data

Jan. 27, 2021 (KR) .................. 10-2021-0011837

(51) Int. Cl.
*H10K 59/131* (2023.01)
*H10K 77/10* (2023.01)
*H10K 102/00* (2023.01)

(52) U.S. Cl.
CPC .......... *H10K 59/131* (2023.02); *H10K 77/111* (2023.02); *H10K 2102/311* (2023.02)

(58) Field of Classification Search
CPC ............... H10K 59/131; H10K 77/111; H10K 2102/311; H10K 2101/00; H10K 59/124; H10K 59/122; H10K 59/1213; H10K 59/123; H10K 59/1216; G06F 1/1626; H01L 27/1225; H01L 27/1244; H01L 27/1248
See application file for complete search history.

(56) References Cited

U.S. PATENT DOCUMENTS

| | | |
|---|---|---|
| 5,831,694 A | 11/1998 | Onisawa et al. |
| 7,303,949 B2 | 12/2007 | Chen et al. |
| 7,442,961 B2 | 10/2008 | Sagawa et al. |
| 7,545,002 B2 | 6/2009 | Maeda et al. |
| 7,557,501 B2 | 7/2009 | Kim et al. |
| 9,490,275 B2 | 11/2016 | Moon et al. |
| 2005/0206304 A1* | 9/2005 | Kim ............... H10K 59/124 313/506 |
| 2017/0271613 A1 | 9/2017 | Ajiki et al. |
| 2019/0386034 A1* | 12/2019 | Lee ............... H01L 27/1222 |

FOREIGN PATENT DOCUMENTS

| | | |
|---|---|---|
| JP | 2006253032 A | 9/2006 |
| JP | 6439194 B2 | 12/2018 |
| KR | 100430744 B1 | 4/2004 |
| KR | 100699988 B1 | 3/2007 |
| KR | 100985935 B1 | 9/2010 |
| KR | 101025761 B1 | 3/2011 |
| KR | 1020160090963 A | 8/2016 |

* cited by examiner

*Primary Examiner* — J. E. Schoenholtz
(74) *Attorney, Agent, or Firm* — CANTOR COLBURN LLP

(57) ABSTRACT

A display apparatus includes a substrate, a first insulating layer on the substrate, first metal layers on the first insulating layer and having a compressive stress or a tensile stress of about 100 megapascals (MPa) or less, and a second insulating layer including a first layer covering the first metal layers and a second layer including a material different from a material of the first layer.

17 Claims, 11 Drawing Sheets

DISPLAY APPARATUS

This application claims to Korean Patent Application No. 10-2021-0011837, filed on Jan. 27, 2021, and all the benefits accruing therefrom under 35 U.S.C. § 119, the content of which in its entirety is herein incorporated by reference.

BACKGROUND

1. Field

Embodiments relate to a display apparatus, and more particularly, to a display apparatus capable of improving reliability thereof.

2. Description of the Related Art

Recently, deformable display apparatuses such as bendable or foldable display apparatuses are being actively developed. Such display apparatuses include various members such as a flexible display panel or a flexible window. The various members may be attached to an upper portion or a lower portion of a display panel so as to be deformable, e.g., bendable or foldable, with the display panel.

The various members are required to have a flexible property so as to be deformable, e.g., bendable or foldable. However, when the various members have a flexible property, reliability against an external impact may be reduced.

SUMMARY

Various members are required to have a flexible property so as to be deformable, e.g., bendable or foldable. However, when the various members have a flexible property, reliability against an external impact may be reduced.

Embodiments include a display apparatus capable of preventing or minimizing damage to a display panel due to an external impact.

Additional features will be set forth in part in the description which follows and, in part, will be apparent from the description, or may be learned by practice of the presented embodiments of the invention.

In an embodiment of the invention, a display apparatus includes a substrate, a first insulating layer on the substrate, first metal layers on the first insulating layer and having a compressive stress or a tensile stress of about 100 megapascals (MPa) or less, and a second insulating layer including a first layer covering the first metal layers and a second layer including a material different from a material of the first layer.

In an embodiment, a stress deviation of the first metal layers may be about 100 MPa or less.

In an embodiment, the first metal layers may have a thickness of about 2,000 angstroms (Å) to about 2,100 Å in a direction perpendicular to a main plane extension direction of the substrate.

In an embodiment, the display apparatus may further include second metal layers between the substrate and the first insulating layer.

In an embodiment, the second metal layers may have a compressive stress or a tensile stress of about 100 MPa or less.

In an embodiment, a stress deviation of the second metal layers may be about 100 MPa or less.

In an embodiment, the second metal layers may have a thickness of about 2,000 Å to about 2,100 Å in a direction perpendicular to a main plane extension direction of the substrate.

In an embodiment, the display apparatus may further include a first thin-film transistor on the substrate, the first thin-film transistor including a first semiconductor layer including an oxide semiconductor, and a first gate electrode insulated from the first semiconductor layer, and a storage capacitor including a first electrode and a second electrode insulated from the first electrode.

In an embodiment, the first metal layers may be in a same layer as the second electrode.

In an embodiment, the second metal layers may be in a same layer as the first gate electrode.

In an embodiment, the display apparatus may further include third metal layers between the first metal layers and the second metal layers.

In an embodiment, the third metal layers may have a compressive stress or a tensile stress of about 100 MPa or less.

In an embodiment, a stress deviation of the third metal layers may be about 100 MPa or less.

In an embodiment, the third metal layers may have a thickness of about 2,000 Å to about 2,100 Å in a direction perpendicular to a main plane extension direction of the substrate.

In an embodiment, the first metal layers may have a thickness of about 2,200 Å to about 2,300 Å in a direction perpendicular to a main plane extension direction of the substrate.

In an embodiment, the display apparatus may further include a second thin-film transistor including a second semiconductor layer including an oxide semiconductor, and a second gate electrode insulated from the second semiconductor layer.

In an embodiment, the first insulating layer may cover the second semiconductor layer.

In an embodiment, the first metal layers may be in a same layer as the second gate electrode.

In an embodiment, a modulus of elasticity of the first insulating layer may be greater than a modulus of elasticity of the second layer, and the modulus of elasticity of the second layer may be greater than a modulus of elasticity of the first layer.

In an embodiment, a hardness of the first insulating layer may be greater than a hardness of the second layer, and the hardness of the second layer may be greater than a hardness of the first layer.

Other embodiments, features, and advantages of the invention will become better understood through the accompanying drawings, the claims and the detailed description.

BRIEF DESCRIPTION OF THE DRAWINGS

The above and other embodiments, features, and advantages of predetermined embodiments of the invention will be more apparent from the following description taken in conjunction with the accompanying drawings, in which.

DETAILED DESCRIPTION

Figure 1:
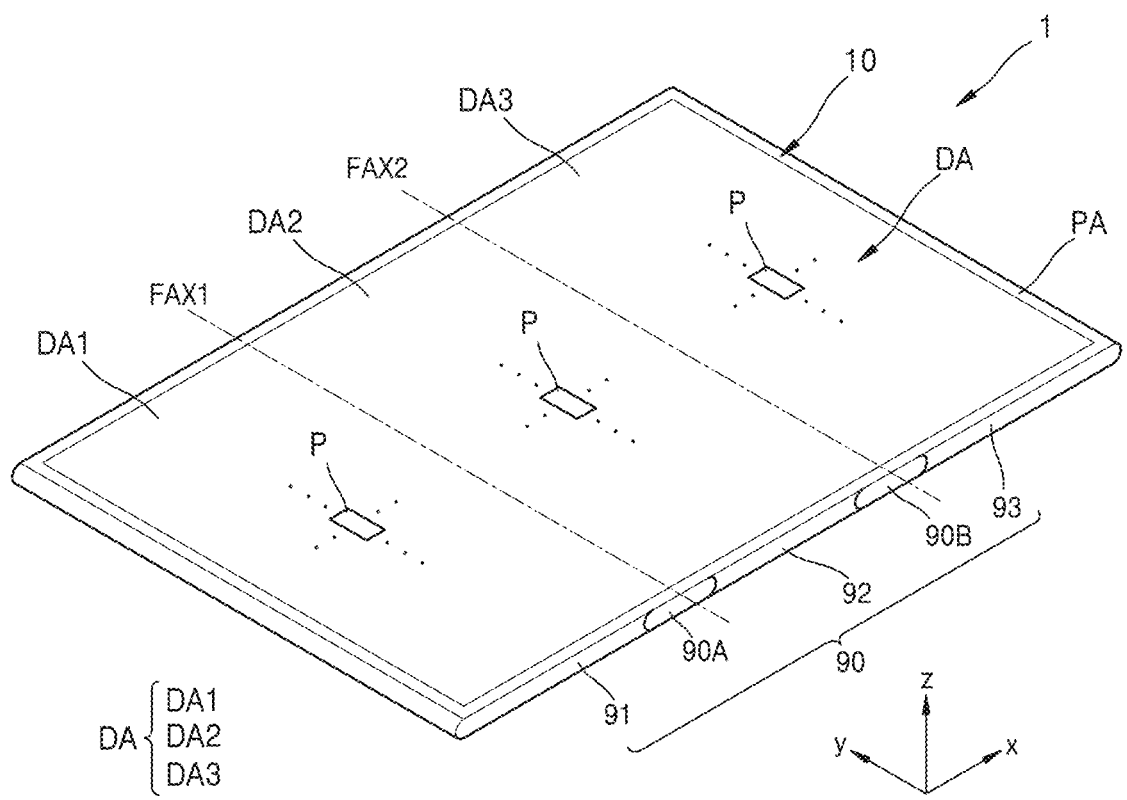
FIGS. 1 and 2 are perspective views schematically illustrating an embodiment of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "comprises" and/or "comprising" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

Also, sizes of elements in the drawings may be exaggerated or reduced for convenience of explanation. In addition, because sizes and thicknesses of elements in the drawings are arbitrarily illustrated for convenience of explanation, the disclosure is not limited thereto.

In this specification, the expression "A and/or B" indicates only A, only B, or both A and B. Throughout the disclosure, the expression "at least one of A and B" indicates only A, only B, or both A and B.

In the following embodiments, the expression "a line extends in a first direction or a second direction" may include a case in which "a line extends in a linear shape" and a case in which "a line extends in a zigzag or curved shape in a first direction or a second direction."

In the following embodiments, the term "in a plan view" means seeing a target portion from above, and the term "in a cross-sectional view" means seeing a vertically cut cross-section of a target portion from side. In the following embodiments, the term "overlapping" may include overlapping "in a plan view" and "in a cross-sectional view."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, embodiments will be described in detail with reference to the accompanying drawings. When describing embodiments with reference to the accompanying drawings, the same or corresponding elements are denoted by the same reference numerals.

Figure 2:
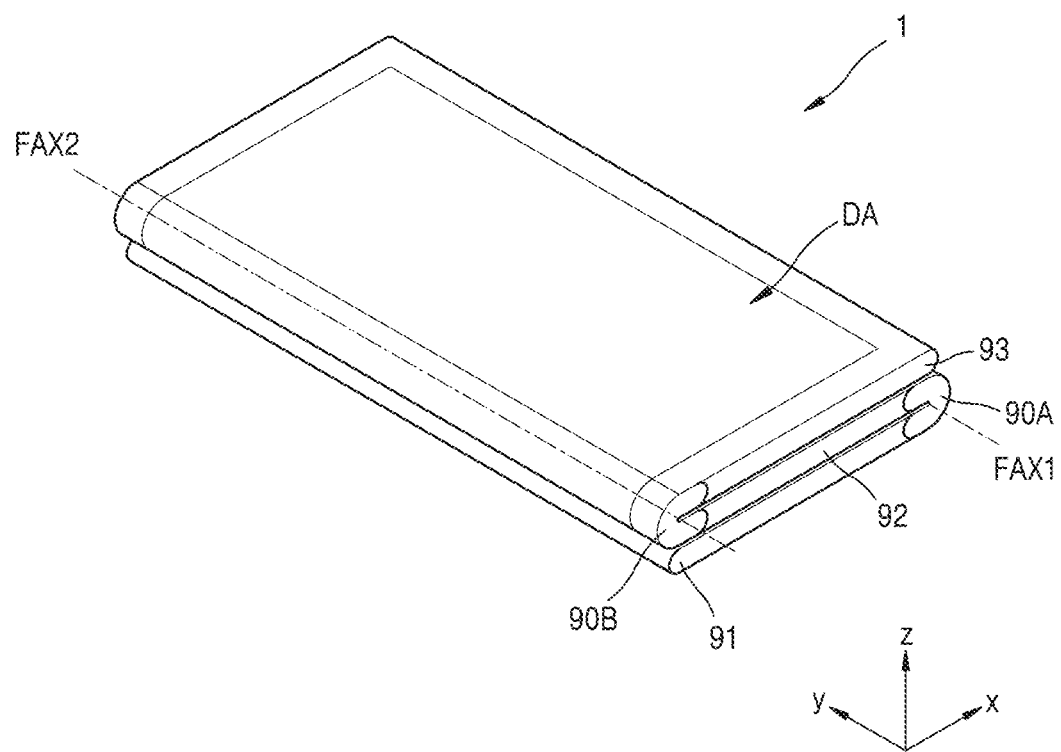

FIGS. 1 and 2 are perspective views schematically illustrating an embodiment of a display apparatus 1. Specifically, FIG. 1 is a perspective view showing a state in which the display apparatus 1 is unfolded, and FIG. 2 is a perspective view illustrating a state in which the display apparatus 1 is folded.

Referring to FIGS. 1 and 2, the display apparatus 1 may include a display panel 10 and a lower cover 90. The display panel 10 may include a display area DA in which an image is displayed, and a peripheral area PA around the display area DA. Pixels P each including a display element may be in the display area DA. The display apparatus 1 may provide an image by light emitted from the pixels P in the display area DA, and the peripheral area PA may be a non-display area in which the pixels P are not arranged.

The display area DA may include a first display area DA1, a second display area DA2, and a third display area DA3. The pixels P may be in the first display area DA1, the second display area DA2, and the third display area DA3. The display apparatus 1 may provide an image through the pixels P in the first display area DA1, the second display area DA2, and the third display area DA3. The first display area DA1, the second display area DA2, and the third display area DA3 may be surrounded by the peripheral area PA.

Hereinafter, as the display apparatus 1 in the embodiment, an organic light-emitting display apparatus will be described as an example, but the invention is not limited thereto. In an embodiment, the display apparatus 1 may include an inorganic light-emitting display (or an inorganic electroluminescence (EL) display) or a quantum dot light-emitting display. In an embodiment, an emission layer of the display element provided in the display apparatus 1 may include an organic material, an inorganic material, quantum dots, an organic material and quantum dots, or an inorganic material and quantum dots, for example.

In an embodiment, the display panel 10 may include a flexible, foldable, or rollable display panel. In an embodiment, the display panel 10 may include at least one of a foldable display panel, a curved display panel with a curved display surface, a bended display panel in which areas other than a display surface are bent, a rollable display panel, and a stretchable display panel, for example. In an embodiment, the display panel 10 may include a rigid display panel that does not bend easily.

In an embodiment, the display panel 10 may include a first folding axis FAX1 and a second folding axis FAX2. The display panel 10 may be foldable relative to the first folding axis FAX1 and the second folding axis FAX2.

The first display area DA1 and the second display area DA2 may be defined with the first folding axis FAX1 therebetween. Also, the second display area DA2 and the third display area DA3 may be defined with the second folding axis FAX2 therebetween.

The lower cover 90 may form the lower surface appearance of the display apparatus 1. The lower cover 90 may include either one of or both of plastic and metal. The lower cover 90 may include a first portion 91, a second portion 92, and a third portion 93 supporting the display panel 10. The lower cover 90 may be foldable about the first folding axis FAX1 between the first portion 91 and the second portion 92. Also, the lower cover 90 may be foldable around the second folding axis FAX2 between the second portion 92 and the third portion 93.

In an embodiment, a first hinge portion 90A may be between the first portion 91 and the second portion 92, and a second hinge portion 90B may be between the second portion 92 and the third portion 93.

In an embodiment, the first display area DA1 and the second display area DA2 may be folded to face each other with respect to the first folding axis FAX1. In an embodiment, the first display area DA1 and the second display area DA2 may be folded not to face each other with respect to the first folding axis FAX1.

In an embodiment, the second display area DA2 and the third display area DA3 may be folded not to face each other with respect to the second folding axis FAX2. In an embodiment, the second display area DA2 and the third display area DA3 may be folded to face each other with respect to the second folding axis FAX2.

In an embodiment, in the case of in-folding in which the first display area DA1 and the second display area DA2 are folded to face each other, the curvature of the folded portion may be 5 R or less. In an alternative embodiment, in the case of in-folding in which the first display area DA1 and the second display area DA2 are folded to face each other, the curvature of the folded portion may be variously modified. In an embodiment, the curvature of the folded portion may be 3 R or less, or may be 1 R or less, for example.

In an embodiment, in the case of out-folding in which the second display area DA2 and the third display area DA3 are folded not to face each other, the curvature of the folded portion may be 5 R or less. In an alternative embodiment, in the case of out-folding in which the second display area DA2 and the third display area DA3 are folded not to face each other, the curvature of the folded portion may be variously modified. In an embodiment, the curvature of the folded portion may be 4 R or less, for example.

Figure 3:
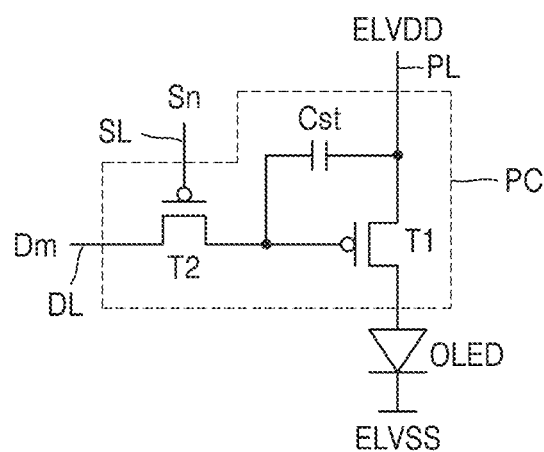
FIGS. 3 and 4 are equivalent circuit diagrams of embodiments of pixel circuits which drive a pixel.
Figure 4:
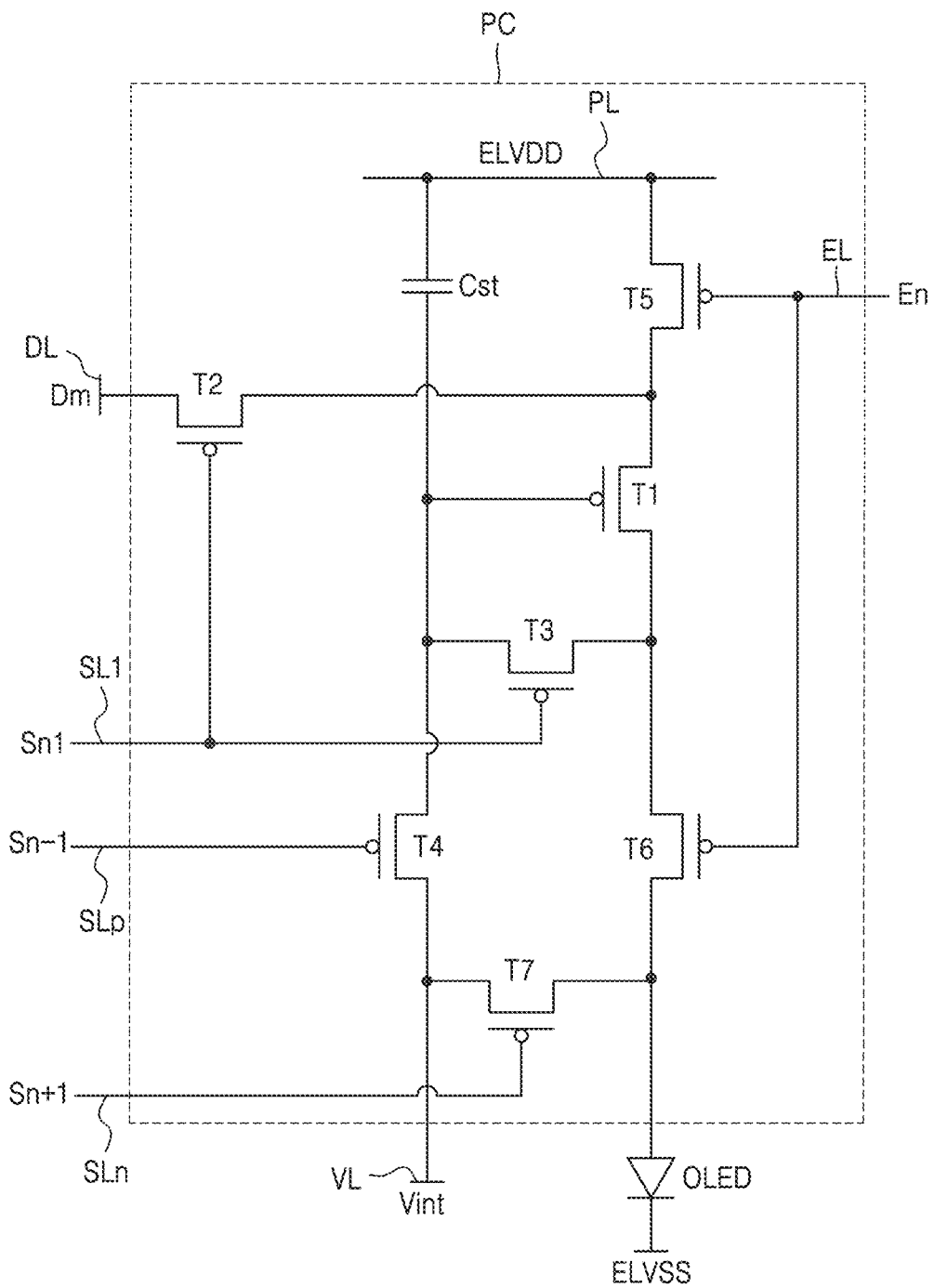

FIGS. 3 and 4 are equivalent circuit diagrams of embodiments of pixel circuits PC which drive a pixel.

Referring to FIG. 3, the display apparatus 1 may include the pixel circuit PC. The pixel circuit PC may be connected to an organic light-emitting diode OLED and implement light emission of pixels. The pixel circuit PC may include a driving thin-film transistor T1, a switching thin-film transistor T2, and a storage capacitor Cst. The switching thin-film transistor T2 may be connected to a scan line SL and a data line DL and may transmit, to the driving thin-film transistor T1, a data signal Dm input through the data line DL in response to a scan signal Sn input through the scan line SL.

The storage capacitor Cst may be connected to the switching thin-film transistor T2 and a driving voltage line PL and may store a voltage corresponding to a difference between a voltage received from the switching thin-film transistor T2 and a driving voltage ELVDD supplied to the driving voltage line PL.

The driving thin-film transistor T1 may be connected to the driving voltage line PL and the storage capacitor Cst and may control a driving current flowing from the driving voltage line PL to the organic light-emitting diode OLED in response to a voltage value stored in the storage capacitor Cst. The organic light-emitting diode OLED may emit light having a predetermined luminance according to the driving current.

Although a case in which the pixel circuit PC includes two thin-film transistors and one storage capacitor has been described with reference to FIG. 3, the invention is not limited thereto.

Referring to FIG. 4, the pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7, and a storage capacitor Cst.

Although FIG. 4 illustrates a case in which signal lines, including a first scan line SL1, a previous scan line SLp, a next scan line SLn, an emission control line EL, and a data line DL, an initialization voltage line VL, and a driving voltage line PL are provided for each pixel circuit PC, the invention is not limited thereto. In an embodiment, the initialization voltage line VL and/or at least one of the signal lines SL1, SLp, SLn, EL, and DL may be shared by neighboring pixel circuits.

A drain region of the driving thin-film transistor T1 may be electrically connected to an organic light-emitting diode OLED via the emission control thin-film transistor T6. The driving thin-film transistor T1 may receive a data signal Dm according to the switching operation of the switching thin-film transistor T2 and supply a driving current to the organic light-emitting diode OLED.

A gate electrode of the switching thin-film transistor T2 may be connected to the first scan line SL1, and a source region of the switching thin-film transistor T2 may be connected to the data line DL. A drain region of the switching thin-film transistor T2 may be connected to a source region of the driving thin-film transistor T1 and connected to the driving voltage line PL via the operation control thin-film transistor T5. The switching thin-film transistor T2 may be turned on in response to a first scan signal Sn1 received through the first scan line SL1 and perform a switching operation of transmitting, to the source region of the driving thin-film transistor T1, the data signal Dm transmitted to the data line DL.

A gate electrode of the compensation thin-film transistor T3 may be connected to the first scan line SL1. A source region of the compensation thin-film transistor T3 may be connected to the drain region of the driving thin-film transistor T1 and connected to a pixel electrode of the organic light-emitting diode OLED via the emission control thin-film transistor T6. A drain region of the compensation thin-film transistor T3 may be connected to one electrode of the storage capacitor Cst, a source region of the first initialization thin-film transistor T4, and a gate electrode of the driving thin-film transistor T1. The compensation thin-film transistor T3 may be turned on in response to the first scan signal Sn1 received through the first scan line SL1 and connect the gate electrode and the drain region of the driving thin-film transistor T1 to each other such that the driving thin-film transistor T1 is diode-connected.

A gate electrode of the first initialization thin-film transistor T4 may be connected to a previous scan line SLp. A drain region of the first initialization thin-film transistor T4 may be connected to an initialization voltage line VL. The source region of the first initialization thin-film transistor T4 may be connected to the one electrode of the storage capacitor Cst, the drain region of the compensation thin-film transistor T3, and the gate electrode of the driving thin-film transistor T1. The first initialization thin-film transistor T4 may be turned on in response to a previous scan signal Sn−1 received through the previous scan line SLp and perform an initialization operation of initializing the voltage of the gate electrode of the driving thin-film transistor T1 by transmitting an initialization voltage Vint to the gate electrode of the driving thin-film transistor T1.

A gate electrode of the operation control thin-film transistor T5 may be connected to the emission control line EL. A source region of the operation control thin-film transistor T5 may be connected to the driving voltage line PL. A drain region of the operation control thin-film transistor T5 may be connected to the source region of the driving thin-film transistor T1 and the drain region of the switching thin-film transistor T2.

A gate electrode of the emission control thin-film transistor T6 may be connected to the emission control line EL. A source region of the emission control thin-film transistor T6 may be connected to the drain region of the driving thin-film transistor T1 and the source region of the compensation thin-film transistor T3. A drain region of the emission control thin-film transistor T6 may be electrically connected to the pixel electrode of the organic light-emitting diode OLED. The operation control thin-film transistor T5 and the emission control thin-film transistor T6 may be simultaneously turned on in response to an emission control signal En received through the emission control line EL, so that the driving voltage ELVDD is transmitted to the organic light-emitting diode OLED and the driving current flows through the organic light-emitting diode OLED.

A gate electrode of the second initialization thin-film transistor T7 may be connected to the next scan line SLn. A source region of the second initialization thin-film transistor T7 may be connected to the pixel electrode of the organic light-emitting diode OLED. A drain region of the second initialization thin-film transistor T7 may be connected to the initialization voltage line VL. The second initialization thin-film transistor T7 may be turned on in response to a next scan signal Sn+1 received through the next scan line SLn and initialize the pixel electrode of the organic light-emitting diode OLED.

Although FIG. 4 illustrates a case in which the first initialization thin-film transistor T4 and the second initialization thin-film transistor T7 are respectively connected to the previous scan line SLp and the next scan line SLn, the invention is not limited thereto. In an embodiment, both the first initialization thin-film transistor T4 and the second initialization thin-film transistor T7 may be connected to the previous scan line SLp and may be driven in response to the previous scan signal Sn−1.

The other electrode of the storage capacitor Cst may be connected to the driving voltage line PL. The one electrode of the storage capacitor Cst may be connected to the gate electrode of the driving thin-film transistor T1, the drain region of the compensation thin-film transistor T3, and the source region of the first initialization thin-film transistor T4.

An opposite electrode (e.g., a cathode) of the organic light-emitting diode OLED may receive a common voltage ELVSS. The organic light-emitting diode OLED may receive the driving current from the driving thin-film transistor T1 and emit light.

The pixel circuit PC is not limited to the number and circuit design of the thin-film transistors and the storage capacitor described with reference to FIGS. 3 and 4, and the number and circuit design of the thin-film transistors and the storage capacitor may be variously changed.

Figure 5:
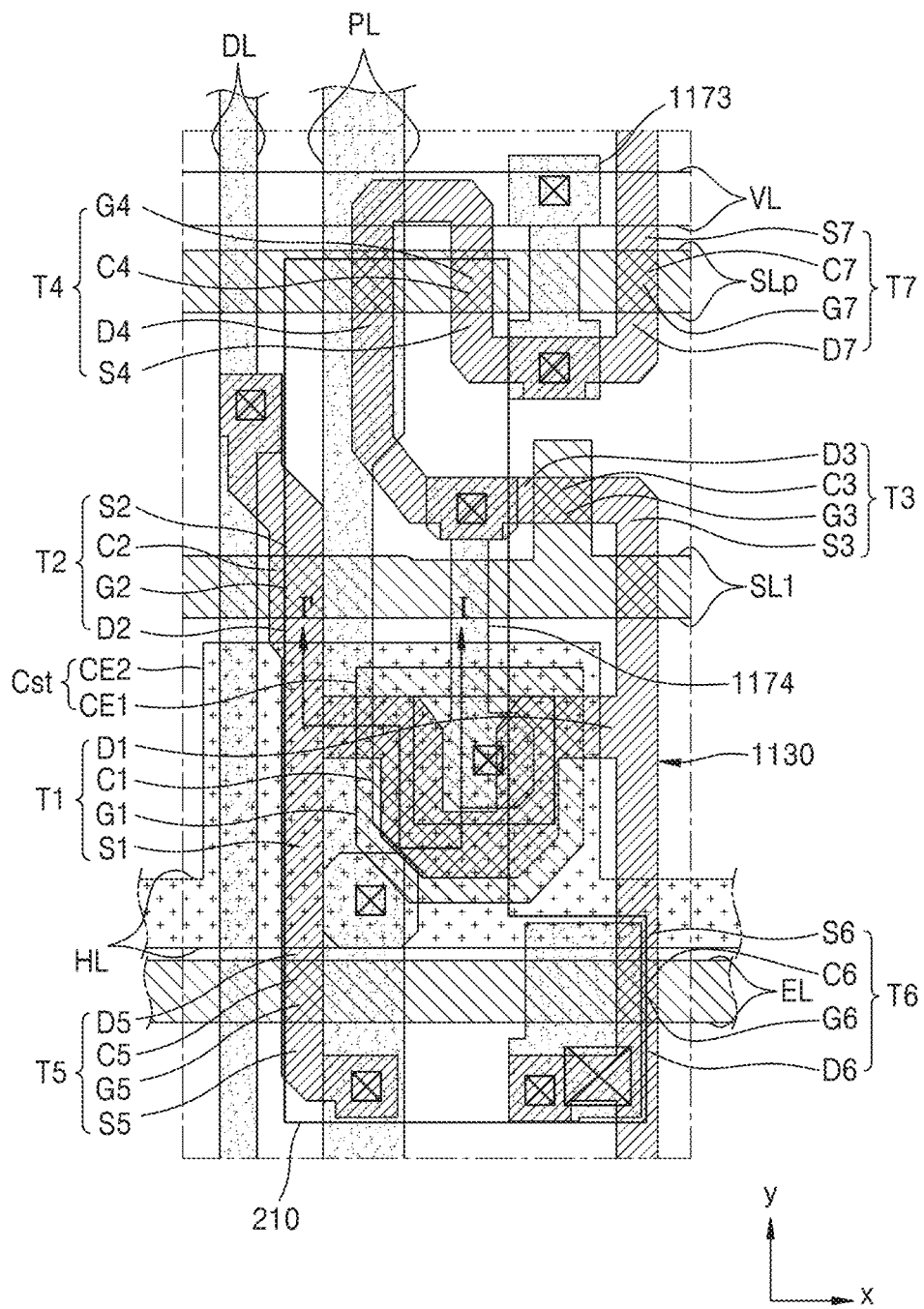
FIG. 5 is a layout diagram schematically illustrating an embodiment of a pixel circuit of a pixel.

FIG. 5 is a layout diagram schematically illustrating an embodiment of a pixel circuit of a pixel.

Referring to FIG. 5, a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7 may be arranged along a semiconductor layer 1130.

The semiconductor layer 1130 may be on a substrate (refer to 100 of FIG. 6) on which a buffer layer (refer to 111 of FIG. 6) including an inorganic insulating material is formed or disposed. In an embodiment, the semiconductor layer 1130 may include low temperature poly-silicon ("LTPS"). Because the poly-silicon has high electron mobility (100 $cm^2$/Vs or more), low energy consumption, and excellent reliability, the poly-silicon may be used as a semiconductor layer of a thin-film transistor in a display apparatus. However, the invention is not limited thereto. The semiconductor layer 1130 may include amorphous silicon (a-Si) and/or an oxide semiconductor, some semiconductor layers of a plurality of thin-film transistors may include LTPS, and other semiconductor layers thereof may include amorphous silicon (a-Si) and/or an oxide semiconductor.

Some areas of the semiconductor layer 1130 correspond to the semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. In other words, the semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be understood as being connected to each other and curved in various shapes.

The semiconductor layer 1130 includes a channel region, and a source region and a drain region on both opposite sides of the channel region. The source region and the drain region may be understood as a source region and a drain region of a corresponding thin-film transistor. The source region and the drain region may be changed with each other according to characteristics of the thin-film transistor. Hereinafter, the terms "source region" and "drain region" are used instead of the "source electrode" or the "drain electrode."

The driving thin-film transistor T1 may include a first channel region C1, a first gate electrode G1 overlapping the first channel region C1, and a first source region S1 and a first drain region D1 on both opposite sides of the first channel region C1. The first channel region C1 overlapping the first gate electrode G1 has a curved shape such as an omega shape, such that a long channel length may be formed or provided in a narrow space. When the first channel region C1 is formed or provided to be long, a driving range of a gate voltage is widened. Therefore, a gray scale of light emitted from the organic light-emitting diode OLED may be controlled more precisely, and display quality may be improved.

The switching thin-film transistor T2 may include a second channel region C2, a second gate electrode G2 overlapping the second channel region C2, and a second source region S2 and a second drain region D2 on both opposite sides of the second channel region C2. The second drain region D2 may be connected to the first source region S1.

The compensation thin-film transistor T3 may include a third channel region C3, a third gate electrode G3 overlapping the third channel region C3, and a third source region S3 and a third drain region D3 on both opposite sides of the third channel region C3. The compensation thin-film transistor T3 may be connected to the first gate electrode G1 of the driving thin-film transistor T1 through a node connection line 1174 to be described later.

The first initialization thin-film transistor T4 may include a fourth channel region C4, a fourth gate electrode G4 overlapping the fourth channel region C4, and a fourth source region S4 and a fourth drain region D4 on both opposite sides of the fourth channel region C4.

The operation control thin-film transistor T5 may include a fifth channel region C5, a fifth gate electrode G5 overlapping the fifth channel region C5, and a fifth source region S5 and a fifth drain region D5 on both opposite sides of the fifth channel region C5. The fifth drain region D5 may be connected to the first source region S1.

The emission control thin-film transistor T6 may include a sixth channel region C6, a sixth gate electrode G6 overlapping the sixth channel region C6, and a sixth source region S6 and a sixth drain region D6 on both opposite sides of the sixth channel region C6. The sixth source region S6 may be connected to the first drain region D1.

The second initialization thin-film transistor T7 may include a seventh channel region C7, a seventh gate electrode G7 overlapping the seventh channel region C7, and a seventh source region S7 and a seventh drain region D7 on both opposite sides of the seventh channel region C7.

The above-described thin-film transistors may be connected to signal lines, including a first scan line SL1, a previous scan line SLp, an emission control line EL, and a data line DL, an initialization voltage line VL, and a driving voltage line PL.

The first scan line SL1, the previous scan line SLp, the emission control line EL, and first to seventh gate electrodes G1 to G7 of the thin-film transistors may be on the above-described semiconductor layer 1130 with an insulating layer (e.g., a first gate insulating layer (refer to 113 of FIG. 6)) therebetween.

The first scan line SL1 may extend in a first direction (x direction). Areas of the first scan line SL1 may correspond to the second and third gate electrodes G2 and G3. In an embodiment, areas of the first scan line SL1 overlapping the channel region C2 of the switching thin-film transistor T2 and the channel region C3 of the compensation thin-film transistor T3 may be the second and third gate electrodes G2 and G3, respectively, for example.

The previous scan line SLp extends in the first direction (x direction), and some areas thereof may correspond to the fourth and seventh gate electrodes G4 and G7, respectively. In an embodiment, areas of the previous scan line SLp overlapping the channel region C4 of the first initialization thin-film transistor T4 and the channel region C7 of the second initialization thin-film transistor T7 may be the fourth and seventh gate electrodes G4 and G7, respectively, for example.

The emission control line EL may extend in a first direction (x direction). Areas of the emission control line EL may correspond to the fifth and sixth gate electrodes G5 and G6, respectively. In an embodiment, areas of the emission control line EL overlapping the channel region C5 the operation control thin-film transistor T5 and the channel region C6 of the emission control thin-film transistor T6 may be the fifth and sixth gate electrodes G5 and G6, respectively, for example.

The first gate electrode G1 is a floating electrode and may be connected to the compensation thin-film transistor T3 through the node connection line 1174.

An electrode voltage line HL may be on the first scan line SL1, the previous scan line SLp, the emission control line EL, and the first gate electrode G1 with an insulating layer (e.g., a second gate insulating layer (refer to 118 of FIG. 6)) therebetween.

The electrode voltage line HL may extend in the first direction (x direction) to cross the data line DL and the driving voltage line PL. A portion of the electrode voltage line HL may cover at least a portion of the first gate electrode G1 and may form a storage capacitor Cst together with the first gate electrode G1. In an embodiment, the first gate electrode G1 may be a first electrode CE1 of the storage capacitor Cst, and a portion of the electrode voltage line HL may be a second electrode CE2 of the storage capacitor Cst, for example.

The second electrode CE2 of the storage capacitor Cst may be electrically connected to the driving voltage line PL. In this regard, the electrode voltage line HL may be connected to the driving voltage line PL on the electrode voltage line HL through a contact hole. Therefore, the electrode voltage line HL may have the same voltage level (constant voltage) as that of the driving voltage line PL. In an embodiment, the electrode voltage line HL may have a constant voltage of about +5 volts (V), for example. The electrode voltage line HL may be understood as a horizontal driving voltage line.

Because the driving voltage lines PL extend in a second direction (y direction) crossing the first direction (x direction) and the electrode voltage lines HL electrically connected to the driving voltage lines PL extend in the first direction (x direction), the driving voltage lines PL and the electrode voltage lines HL may form a mesh structure in the display area.

The data line DL, the driving voltage line PL, the initialization connection line 1173, and the node connection line 1174 may be on the electrode voltage line HL with an insulating layer (e.g., an interlayer insulating layer (refer to 119 of FIG. 6)) therebetween.

The data line DL may extend in the second direction (y direction) and may be connected to the second source region S2 of the switching thin-film transistor T2 through a contact hole.

The driving voltage line PL may extend in the second direction (y direction) and may be connected to the electrode voltage line HL through a contact hole, as described above. Also, the driving voltage line PL may be connected to the operation control thin-film transistor T5 through a contact hole. The driving voltage line PL may be connected to the fifth drain region D5 through a contact hole.

One end of the initialization connection line 1173 may be connected to the first and second initialization thin-film transistors T4 and T7 through a contact hole, and the other end of the initialization connection line 1173 may be connected to the initialization voltage line VL to be described later through a contact hole.

One end of the node connection line 1174 may be connected to the third drain region D3 through a contact hole, and the other end of the node connection line 1174 may be connected to the first gate electrode G1 through a contact hole.

The initialization voltage line VL may be on the data line DL, the driving voltage line PL, the initialization connection line 1173, and the node connection line 1174 with an insulating layer (e.g., a planarization layer 120) therebetween.

The initialization voltage line VL may extend in the first direction (x direction). The initialization voltage line VL may be connected to the first and second initialization thin-film transistors T4 and T7 through the initialization connection line 1173. The initialization voltage line VL may have a constant voltage (e.g., −2 V, etc.).

Figure 6:
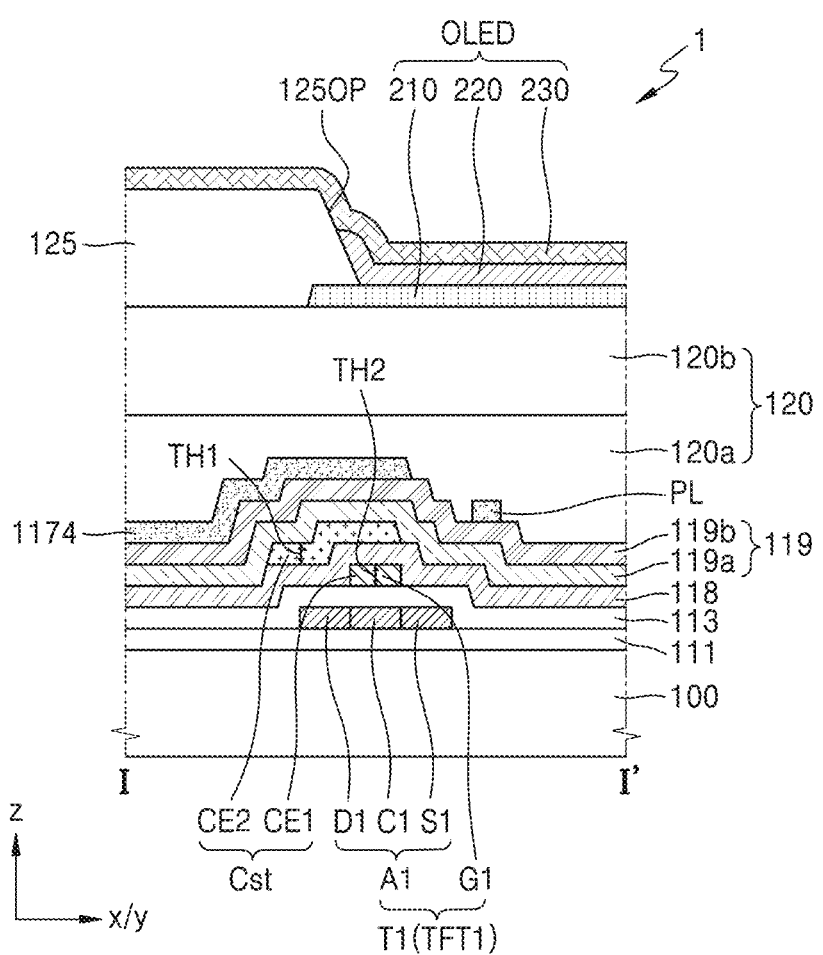
FIG. 6 is a cross-sectional view schematically illustrating an embodiment of a display apparatus.

FIG. 6 is a cross-sectional view schematically illustrating an embodiment of a display apparatus 1. FIG. 6 is a cross-sectional view of the display apparatus 1 taken along line I-I' of FIG. 5.

Referring to FIG. 6, the display apparatus 1 may include a substrate 100. The substrate 100 may include a glass material, a ceramic material, a metal material, or a flexible or bendable material. In an embodiment, when the substrate 100 includes flexible or bendable characteristics, the substrate 100 may include a first base layer, a first barrier layer, a second base layer, and a second barrier layer, which are sequentially stacked. The first base layer and the second base layer may include a polymer resin having high heat resistance. In an embodiment, the first base layer and the second base layer may include at least one material of polyethersulfone, polyacrylate, polyether imide, polyethylene naphthalate, polyethylene terephthalate, polyphenylene sulfide, polyarylate, polyimide, polycarbonate, cellulose triacetate, cellulose acetate propionate, and polyarylene ether sulfone, for example. In an embodiment, the first base layer and the second base layer may include polyimide.

The first barrier layer may be between the first base layer and the second base layer. The first barrier layer may be on the first base layer to reduce or prevent infiltration of foreign matter, moisture, or ambient air from below.

The second barrier layer may be on the second base layer. The second barrier layer may be on the second base layer to reduce or prevent infiltration of foreign matter, moisture, or ambient air from below.

In an embodiment, the first barrier layer and the second barrier layer may include an inorganic insulating material such as silicon nitride ($SiN_x$), silicon oxide ($SiO_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). In an embodiment, the first barrier layer and the second barrier layer may include the same material as each other. In an embodiment, the first barrier layer and the second barrier layer may include silicon oxide ($SiO_x$). In an embodiment, the first barrier layer and the second barrier layer may include different materials from each other, for example. In an embodiment, the first barrier layer and/or the second barrier layer may be omitted, for example.

A buffer layer 111 may be on the substrate 100. The buffer layer 111 may be on the substrate 100, may reduce or prevent infiltration of foreign material, moisture, or ambient air from below the substrate 100, and may provide a flat upper surface. In an embodiment, the buffer layer 111 may include an inorganic insulating material such as silicon nitride ($SiN_x$), silicon oxide ($SiO_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO).

In an embodiment, the buffer layer 111 may include a first buffer layer and a second buffer layer. In an embodiment, the first buffer layer and the second buffer layer may include the same material as each other. In an embodiment, the first buffer layer and the second buffer layer may include different materials from each other.

A driving thin-film transistor T1 (e.g., a first thin-film transistor TFT1) and a storage capacitor Cst may be on the buffer layer 111. The first thin-film transistor TFT1 may include a first semiconductor layer A1 and a first gate electrode G1. The storage capacitor Cst may include a first electrode CE1 and a second electrode CE2.

In an embodiment, the first semiconductor layer A1 may be on the buffer layer 111 and may include polysilicon. In an embodiment, the first semiconductor layer A1 may include amorphous silicon. The first semiconductor layer A1 may include a first channel region C1, and a first source region S1 and a first drain region doped with impurities.

A first gate insulating layer 113 may be provided to cover the first semiconductor layer A1. In an embodiment, the first gate insulating layer 113 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The first gate insulating layer 113 may include a single layer or multiple layers including the above-described inorganic insulating material.

A first gate electrode G1 may be on the first gate insulating layer 113 to overlap the first semiconductor layer A1. The first gate electrode G1 may include molybdenum (Mo), aluminum (Al), copper (Cu), titanium (Ti), and the like, and may include a single layer or multiple layers. In an embodiment, the first gate electrode G1 may include molybdenum (Mo), for example.

The second gate insulating layer 118 may be provided to cover the first gate electrode GE1. In an embodiment, the second gate insulating layer 118 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The second gate insulating layer 118 may include a single layer or multiple layers including the above-described inorganic insulating material. In an embodiment, the second gate insulating layer 118 may include silicon nitride ($SiN_x$), for example.

The second electrode CE2 of the storage capacitor Cst may be on the second gate insulating layer 118. The second electrode CE2 may overlap the first gate electrode G1 therebelow. The first gate electrode G1 and the second electrode CE2 overlapping each other with the second gate insulating layer 118 therebetween may constitute the storage capacitor Cst. In an embodiment, the first gate electrode G1 may be the first electrode CE1 of the storage capacitor Cst. In an embodiment, the first electrode CE1 of the storage capacitor Cst may be provided as a separate and independent element.

The second electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the above-described material. In an embodiment, the second electrode CE2 may include molybdenum (Mo), for example.

An interlayer insulating layer 119 may be provided to cover the second electrode CE2. In an embodiment, the interlayer insulating layer 119 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 119 may include a single layer or multiple layers including the above-described inorganic insulating material.

In an embodiment, the interlayer insulating layer 119 may include a first interlayer insulating layer 119a and a second interlayer insulating layer 119b. In an embodiment, the interlayer insulating layer 119 may include the first interlayer insulating layer 119a on the second electrode CE2 and the second interlayer insulating layer 119b on the first interlayer insulating layer 119a. In an embodiment, the first interlayer insulating layer 119a and the second interlayer insulating layer 119b may include the same material as each other. In an embodiment, both the first interlayer insulating layer 119a and the second interlayer insulating layer 119b may include silicon oxide ($SiO_x$), or both the first interlayer insulating layer 119a and the second interlayer insulating layer 119b may include silicon nitride ($SiN_x$), for example. In an embodiment, the first interlayer insulating layer 119a and the second interlayer insulating layer 119b may include different materials from each other. In an embodiment, the first interlayer insulating layer 119a may include silicon oxide ($SiO_x$), and the second interlayer insulating layer 119b may include silicon nitride ($SiN_x$), for example. Also, on the contrary, the first interlayer insulating layer 119a may include silicon nitride ($SiN_x$), and the second interlayer insulating layer 119b may include silicon oxide ($SiO_x$).

A node connection line 1174 and a driving voltage line PL may be on the interlayer insulating layer 119. The node connection line 1174 and the driving voltage line PL may include a conductive material including molybdenum (Mo), aluminum (Al), copper (Cu), titanium (Ti), and the like, and may include a single layer or multiple layers including the above-described material. In an embodiment, the node connection line 1174 and the driving voltage line PL may have a multilayer structure of titanium (Ti)/aluminum (AD/titanium (Ti).

A planarization layer 120 may be provided to cover the node connection line 1174 and the driving voltage line PL. The planarization layer 120 may have a flat upper surface so that a pixel electrode 210 arranged thereon may be formed or provided to be flat.

The planarization layer 120 may include an organic material or an inorganic material, and may have a single-layer structure or a multilayer structure. In an embodiment, the planarization layer 120 may include a general-purpose polymer (e.g., benzocyclobutene ("BCB"), polyimide, hexamethyldisiloxane ("HMDSO"), polymethylmethacrylate ("PMMA"), or polystyrene ("PS")), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer. In an embodiment, the planarization layer 120 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). After the planarization layer 120 is formed or provided, chemical mechanical polishing may be performed on the upper surface thereof so as to provide the flat upper surface.

In an embodiment, the planarization layer 120 may include a first planarization layer 120a and a second planarization layer 120b. The first planarization layer 120a and the second planarization layer 120b may include the same material as each other. In an embodiment, both the first planarization layer 120a and the second planarization layer 120b may include polyimide, for example. The first planarization layer 120a and the second planarization layer 120b may include different materials from each other.

An organic light-emitting diode OLED including a pixel electrode 210, an intermediate layer 220, and an opposite electrode 230 may be on the planarization layer 120.

The pixel electrode 210 may be on the planarization layer 120. In an embodiment, the pixel electrode 210 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In an embodiment, the pixel electrode 210 may include a reflective layer including silver (Ag), magnesium (Mg), aluminum (Al), platinum (Pt), palladium (Pd), gold (Au), nickel (Ni), neodymium (Nd), Iridium (Ir), chromium (Cr), or any combination thereof. In an embodiment, the pixel electrode 210 may have a structure including layers including ITO, IZO, ZnO, or $In_2O_3$ above and/or below the reflective layer, for example. In this case, the pixel electrode 210 may have a structure in which ITO/Ag/ITO are stacked.

A pixel defining layer 125 may be on the planarization layer 120. The pixel defining layer 125 may be on the planarization layer 120 and may cover edges of the pixel electrode 210. An opening 1250P exposing at least a portion of the pixel electrode 210 may be defined in the pixel defining layer 125.

The pixel defining layer 125 may prevent an electric arc or the like from occurring on the edges of the pixel electrode 210 by increasing the distance between the pixel electrode 210 and the opposite electrode 230 on the pixel electrode 210. In an embodiment, the pixel defining layer 125 may be formed or provided through spin coating or the like by an organic insulating material such as polyimide, polyamide, acrylic resin, benzocyclobutene, HMDSO, and phenol resin.

Although not illustrated, a spacer for preventing a mask dent may be further on the pixel defining layer 125. The spacer may be formed or provided unitarily with the pixel defining layer. In an embodiment, the spacer and the pixel defining layer 125 may be simultaneously formed or provided in the same process by a half-tone mask process, for example.

The intermediate layer 220 may be in the opening 1250P of the pixel defining layer 125 to correspond to the pixel electrode 210. The intermediate layer 220 may include an emission layer. The emission layer may include a high molecular weight organic material or a low molecular weight organic material, and may emit red light, green light, blue light, or white light.

In an embodiment, the intermediate layer 220 may further include organic functional layers above and/or below the emission layer. The organic functional layers may include a first functional layer and/or a second functional layer. In an embodiment, the first functional layer and/or the second functional layer may be omitted.

The first functional layer may be below the emission layer. The first functional layer may include a single layer or multiple layers including an organic material. The first functional layer may include a hole transport layer ("HTL")

having a single-layer structure. In an alternative embodiment, the first functional layer may include a hole injection layer ("HIL") and an HTL.

The second functional layer may be above the emission layer. The second functional layer may include a single layer or multiple layers including an organic material. The second functional layer may include an electron transport layer ("ETL") and/or an electron injection layer ("EIL").

The opposite electrode 230 may be on the intermediate layer 220. The opposite electrode 230 may include a conductive material having a low work function. In an embodiment, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof, for example. In an alternative embodiment, the opposite electrode 230 may further include a layer such as ITO, IZO, ZnO, or $In_2O_3$ on the (semi)transparent layer including the above-described material.

In an embodiment, a capping layer (not illustrated) including an organic material may be on the opposite electrode 230. The capping layer may protect the opposite electrode 230 and increase light extraction efficiency. The capping layer may include an organic material having a refractive index higher than that of the opposite electrode 230. In an embodiment, the capping layer may include an inorganic material.

In an embodiment, a first insulating layer may be on the substrate 100. In an embodiment, the first insulating layer may be the second gate insulating layer 118 described above. The first insulating layer may include silicon nitride ($SiN_x$), for example.

In an embodiment, first metal layers may be on the first insulating layer (e.g., the second gate insulating layer 118). The first metal layers may refer to layers on the first insulating layer (e.g., the second gate insulating layer 118). In an embodiment, the first metal layers may be the electrode voltage line HL (e.g., the second electrode CE2) on the first insulating layer (e.g., the second gate insulating layer 118), for example. In an alternative embodiment, when at least one of the first scan line SL1, the previous scan line SLp, the emission control line EL, the data line DL, and the driving voltage line PL are on the first insulating layer (e.g., the second gate insulating layer 118), the first metal layers may be at least one of the first scan line SL1, the previous scan line SLp, and at least one of the emission control line EL, the data line DL, and the driving voltage line PL.

In an embodiment, a second insulating layer may be on the first metal layers. In an embodiment, the second insulating layer may be the above-described interlayer insulating layer 119. The second insulating layer (e.g., the interlayer insulating layer 119) may include a first layer and a second layer including a material different from that of the first layer, for example. In an embodiment, the first layer of the second insulating layer may be the first interlayer insulating layer 119a, and the second layer of the second insulating layer may be the second interlayer insulating layer 119b, for example. The first layer (e.g., the first interlayer insulating layer 119a) may include silicon oxide ($SiO_x$), and the second layer (e.g., the second interlayer insulating layer 119b) may include silicon nitride ($SiN_x$). Also, on the contrary, the first layer (e.g., the first interlayer insulating layer 119a) may include silicon nitride ($SiN_x$), and the second layer (e.g., the second interlayer insulating layer 119b) may include silicon oxide ($SiO_x$).

In an embodiment, second metal layers may be between the substrate 100 and the first insulating layer (e.g., the second gate insulating layer 118). The second metal layers may refer to layers on the first gate insulating layer 113. In an embodiment, the second metal layers may include at least one of the first to seventh gate electrodes G1 to G7, the first scan line SL1, the previous scan line SLp, the next scan line SLn, and the emission control line EL, which are on the first gate insulating layer 113, for example. In an alternative embodiment, when the data line DL, the electrode voltage line HL, and the driving voltage line PL are on the first gate insulating layer 113, the second metal layers may include at least one of the data line DL, the electrode voltage line HL, and the driving voltage line PL.

When a touch pen touches the display panel (refer to 10 of FIG. 1), a pointed portion of the touch pen causes bending deformation in a portion of the display panel 10, and the bending deformation causes a tensile stress in a plane direction. Thus, cracks may occur in the insulating layers including an inorganic material. Also, the cracks in the insulating layers may cause bright spots or dark spots in the display apparatus 1.

Figure 7:
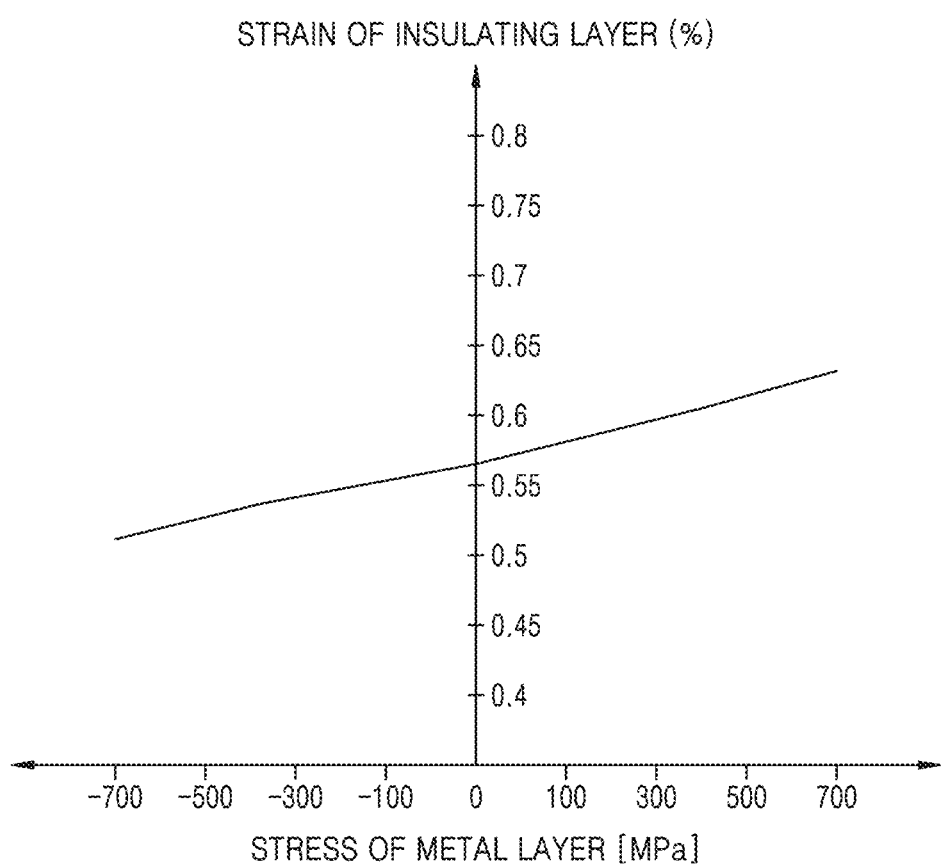
FIG. 7 is a graph showing an embodiment of a strain of an insulating layer with respect to a stress of a metal layer.
Figure 8:
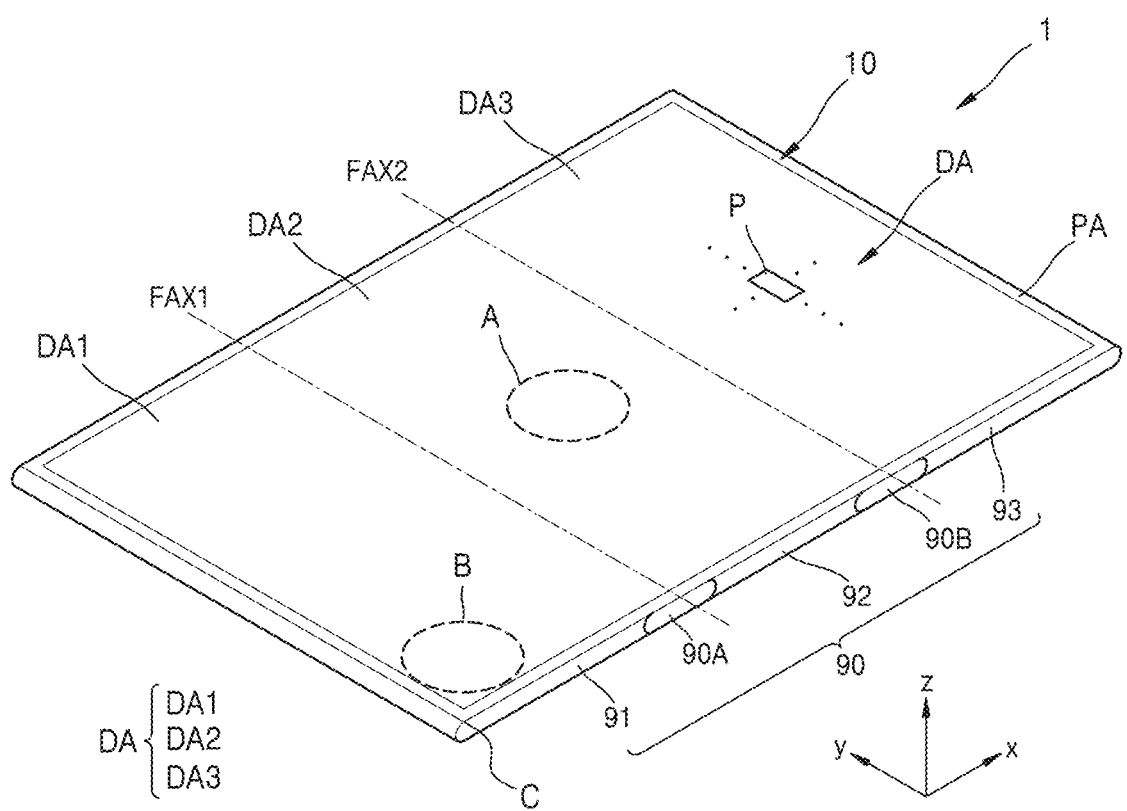
FIG. 8 is a perspective view schematically illustrating an embodiment of a display apparatus.

FIG. 7 is a graph showing an embodiment of a strain of an insulating layer with respect to a stress of a metal layer, and FIG. 8 is a perspective view schematically illustrating an embodiment of a display apparatus.

Referring to FIGS. 7 and 8, when the metal layer has a tensile stress, it may be confirmed that as the tensile stress of the metal layer increases, the strain of the insulating layer increases. Therefore, the metal layer has a tensile stress, and as the tensile stress of the metal layer increases, the strain of the insulating layer increases, thus increasing the possibility of occurrence of cracks in the insulating layer.

When the metal layer has a compressive stress, it may be confirmed that as the compressive stress of the metal layer increases, the strain of the insulating layer decreases. Therefore, the metal layer has compressive stress, and as the compressive stress of the metal layer increases, the strain of the insulating layer decreases, thus decreasing the possibility of occurrence of cracks in the insulating layer.

The metal layers (e.g., the first metal layers and the second metal layers) in a portion B adjacent to a corner portion C of the display panel 10 may have compressive stress characteristics. On the contrary, the metal layers (e.g., the first metal layers and the second metal layers) in a central portion A of the display panel 10 may have tensile stress characteristics. Also, the insulating layers above and/or below the metal layers (e.g., the first metal layers and the second metal layers) may have compressive stress characteristics.

Because the metal layers (e.g., the first metal layers and the second metal layers) in the portion B adjacent to the corner portion C of the display panel 10 and the insulating layers above and/or below the metal layers (e.g., the first metal layers and the second metal layers) all have a compressive stress, the portion B adjacent to the corner portion C of the display panel 10 may have an impact resistance of at least about 7 centimeters (cm). At this time, the impact resistance may be confirmed through a pen drop impact resistance test. The pen drop impact resistance test may be performed by inspecting whether the display panel is damaged when about 5.8 gram (g) predetermined pen (e.g., Societe Bic's fine Bic pen) freely drops in a state of being perpendicular to the display panel.

While the metal layers (e.g., the first metal layers and the second metal layers) in the central portion A of the display panel 10 have a tensile stress, the insulating layers above and/or below the metal layers (e.g., the first metal layers and the second metal layers) have a compressive stress. Because the metal layers (e.g., the first metal layers and the second metal layers) and the insulating layers have opposite stresses, the central portion A of the display panel 10 may have an impact resistance of about 4 cm.

For example, because the metal layers (e.g., the first metal layers and the second metal layers) and the insulating layers have opposite stresses, stress mismatch occurs. Thus, the central portion A of the display panel 10 may have lower impact resistance than the portion B adjacent to the corner portion C of the display panel 10. Also, a difference in impact resistance may occur between the central portion A of the display panel 10 and the portion B adjacent to the corner portion C of the display panel 10. That is, a dispersion of the result of the pen drop impact resistance test between the central portion A of the display panel 10 and the portion B adjacent to the corner portion C of the display panel 10 may increase.

In an embodiment, the first metal layers on the first insulating layer (e.g., the second gate insulating layer 118) may have a first thickness (e.g., TH1 in FIG. 6) in a third direction (z direction) which is perpendicular to a main plane extension direction of the substrate 100 (refer to FIG. 6) defined by the first and second directions (x and y directions). In this case, the first thickness may be about 2,000 angstroms (Å) to about 2,100 Å. When the first metal layers have a thickness of less than 2,000 Å, problems such as an abnormal luminance, an increase in crosstalk, and an increase in the level of spots may occur due to scan on time ("SOT") delay. When the first metal layers have a thickness of greater than 2,100 Å, the tensile stress of the first metal layers may increase. Therefore, the first metal layers may have a thickness of about 2,000 Å to about 2,100 Å, so that the reliability of the display panel 10 may be improved and the first metal layers may have a low tensile stress or compressive stress.

In an embodiment, the metal layers (e.g., the first metal layers) on the first insulating layer (e.g., the second gate insulating layer 118) may have a compressive stress or a tensile stress of about 100 MPa or less. In an embodiment, because the metal layers (e.g., the first metal layers) have a compressive stress or a tensile stress of about 100 MPa or less, the layer density of the metal layers (e.g., the first metal layers) may increase and the grain size of the metal layers (e.g., the first metal layers) may decrease.

Because the metal layers (e.g., the first metal layers) have a compressive stress or a tensile stress of about 100 MPa or less, the strain of the insulating layers above and/or below the metal layers (e.g., the first metal layers) may decrease, and thus, the occurrence of cracks in the insulating layer may be prevented or minimized. Also, the impact resistance of the display panel 10 may be improved by reducing the difference in stress between the metal layers (e.g., the first metal layers) and the insulating layer.

A stress deviation of the metal layers (e.g., the first metal layers) on the insulating layer (e.g., the second gate insulating layer 118) may be about 100 MPa or less. Specifically, the difference between the stress of the metal layer having the greatest stress and the stress of the metal layer having the least stress among the metal layers (e.g., the first metal layers) on the insulating layer (e.g., the second gate insulating layer 118) may be about 100 MPa or less. In an embodiment, the stress deviation between the metal layers (e.g., the first metal layers) in the portion B adjacent to the corner portion C of the display panel 10 and the metal layers (e.g., the first metal layers) in the central portion A of the display panel 10 may be about 100 MPa or less, for example. Therefore, the metal layers (e.g., the first metal layers) in the portion B adjacent to the corner portion C of the display panel 10 and the metal layers (e.g., the first metal layers) in the central portion A of the display panel 10 may have similar stresses to each other. Because the stress deviation of the metal layers (e.g., the first metal layers) on the insulating layer (e.g., the first insulating layer) is about 100 MPa or less, the portion B adjacent to the corner portion C of the display panel 10 and the central portion A of the display panel 10 have similar impact resistances to each other, and thus, the impact resistance dispersion of the display panel 10 may be reduced. In an embodiment, the impact resistance dispersion between the portion B adjacent to the corner portion C of the display panel 10 and the central portion A of the display panel 10 may be about 1 cm or less, for example. That is, the impact resistance dispersion of the display panel 10 may be reduced. Also, the portion B adjacent to the corner portion C of the display panel 10 and the central portion A of the display panel 10 may all have an impact resistance dispersion of about 7 cm or more.

In an embodiment, the second metal layers may have a second thickness (e.g., TH2 in FIG. 6). In this case, the second thickness may be about 2,000 Å to about 2,100 Å. When the second metal layers have a thickness of less than 2,000 Å, problems such as an abnormal luminance, an increase in crosstalk, and an increase in the level of spots may occur due to the SOT delay. When the second metal layers have a thickness of greater than 2,100 Å, the tensile stress of the second metal layers may increase. Therefore, the second metal layers may have a thickness of about 2,000 Å to about 2,100 Å, so that the reliability of the display panel 10 may be improved and the second metal layers may have a low tensile stress or compressive stress.

In an embodiment, the metal layers (e.g., the second metal layers) may have a compressive stress or a tensile stress of about 100 MPa or less. In an embodiment, because the metal layers (e.g., the second metal layers) have a compressive stress or a tensile stress of about 100 MPa or less, the layer density of the metal layers (e.g., the second metal layers) may increase and the grain size of the metal layers (e.g., the second metal layers) may decrease.

Because the metal layers (e.g., the second metal layers) have a compressive stress or a tensile stress of about 100 MPa or less, the strain of the insulating layers above and/or below the metal layers (e.g., the second metal layers) may decrease, and thus, the occurrence of cracks in the insulating layer may be prevented or minimized. Also, the impact resistance of the display panel 10 may be improved by reducing the difference in stress between the metal layers (e.g., the second metal layers) and the insulating layer.

A stress deviation of the metal layers (e.g., the second metal layers) on the insulating layer may be about 100 MPa or less. Specifically, the difference between the stress of the metal layer having the greatest stress and the stress of the metal layer having the least stress among the metal layers (e.g., the second metal layers) on the insulating layer (e.g., the first gate insulating layer 113) may be about 100 MPa or less. In an embodiment, the stress deviation between the metal layers (e.g., the second metal layers) in the portion B adjacent to the corner portion C of the display panel 10 and the metal layers (e.g., the second metal layers) in the central portion A of the display panel 10 may be about 100 MPa or less, for example. Therefore, the metal layers (e.g., the second metal layers) in the portion B adjacent to the corner portion C of the display panel 10 and the metal layers (e.g., the second metal layers) in the central portion A of the display panel 10 may have similar stresses to each other. Because the stress deviation of the metal layers (e.g., the second metal layers) on the insulating layer (e.g., the first insulating layer) is about 100 MPa or less, the portion B adjacent to the corner portion C of the display panel 10 and the central portion A of the display panel 10 have similar impact resistances to each other, and thus, the impact resistance dispersion of the display panel 10 may be reduced. In an embodiment, the impact resistance dispersion between the portion B adjacent to the corner portion C of the display panel 10 and the central portion A of the display panel 10 may be about 1 cm or less, or the impact resistance dispersion between the portion B adjacent to the corner portion C of the display panel 10 and the central portion A of the display panel 10 may be about 2 cm or less, for example. Also, the portion B adjacent to the corner portion C of the display panel 10 and the central portion A of the display panel 10 may all have an impact resistance dispersion of about 7 cm or more.

In an embodiment, electrodes and/or lines on the first insulating layer (e.g., the second gate insulating layer 118) may be the first metal layers. That is, the first metal layers may refer to at least one electrode and/or line on the first insulating layer (e.g., the second gate insulating layer 118).

In an embodiment, electrodes and/or lines on the third insulating layer (e.g., the first gate insulating layer 113) may be the second metal layers. That is, the second metal layers may refer to at least one electrode and/or line on the third insulating layer (e.g., the first gate insulating layer 113).

In an embodiment, the modulus of elasticity of the first insulating layer (e.g., the second gate insulating layer 118) may be greater than the modulus of elasticity of the second layer (e.g., the second interlayer insulating layer 119b) of the second insulating layer (e.g., the interlayer insulating layer 119), and the modulus of elasticity of the second layer (e.g., the second interlayer insulating layer 119b) of the second insulating layer (e.g., the interlayer insulating layer 119) may be greater than the modulus of elasticity of the first layer (e.g., the first interlayer insulating layer 119a) of the second insulating layer (e.g., the interlayer insulating layer 119). That is, among the first insulating layer (e.g., the second gate insulating layer 118), the first layer (e.g., the first interlayer insulating layer 119a) of the second insulating layer (e.g., the interlayer insulating layer 119), and the second layer (e.g., the second interlayer insulating layer 119b) of the second insulating layer (e.g., the interlayer insulating layer 119), the first insulating layer (e.g., the second gate insulating layer 118) has the greatest modulus of elasticity, and the first layer (e.g., the first interlayer insulating layer 119a) of the second insulating layer (e.g., the interlayer insulating layer 119) may have the least modulus of elasticity.

Also, in an embodiment, the hardness of the first insulating layer (e.g., the second gate insulating layer 118) may be greater than the hardness of the second layer (e.g., the second interlayer insulating layer 119b) of the second insulating layer (e.g., the interlayer insulating layer 119), and the hardness of the second layer (e.g., the second interlayer insulating layer 119b) of the second insulating layer (e.g., the interlayer insulating layer 119) may be greater than the hardness of the first layer (e.g., the first interlayer insulating layer 119a) of the second insulating layer (e.g., the interlayer insulating layer 119). That is, among the first insulating layer (e.g., the second gate insulating layer 118), the first layer (e.g., the first interlayer insulating layer 119a) of the second insulating layer (e.g., the interlayer insulating layer 119), and the second layer (e.g., the second interlayer insulating layer 119b) of the second insulating layer (e.g., the interlayer insulating layer 119), the first insulating layer (e.g., the second gate insulating layer 118) has the greatest hardness, and the first layer (e.g., the first interlayer insulating layer 119a) of the second insulating layer (e.g., the interlayer insulating layer 119) may have the least hardness.

In an embodiment, the layer density of the first insulating layer (e.g., the second gate insulating layer 118) may be greater than the layer density of the second layer (e.g., the second interlayer insulating layer 119b) of the second insulating layer (e.g., the interlayer insulating layer 119), and the layer density of the second layer (e.g., the second interlayer insulating layer 119b) of the second insulating layer (e.g., the interlayer insulating layer 119) may be greater than the layer density of the first layer (e.g., the first interlayer insulating layer 119a) of the second insulating layer (e.g., the interlayer insulating layer 119). That is, among the first insulating layer (e.g., the second gate insulating layer 118), the first layer (e.g., the first interlayer insulating layer 119a) of the second insulating layer (e.g., the interlayer insulating layer 119), and the second layer (e.g., the second interlayer insulating layer 119b) of the second insulating layer (e.g., the interlayer insulating layer 119), the first insulating layer (e.g., the second gate insulating layer 118) has the greatest layer density, and the first layer (e.g., the first interlayer insulating layer 119a) of the second insulating layer (e.g., the interlayer insulating layer 119) may have the least layer density.

That is, among the first insulating layer (e.g., the second gate insulating layer 118), the first layer (e.g., the first interlayer insulating layer 119a) of the second insulating layer (e.g., the interlayer insulating layer 119), and the second layer (e.g., the second interlayer insulating layer 119b) of the second insulating layer (e.g., the interlayer insulating layer 119), the modulus of elasticity, the hardness, and the layer density of the first insulating layer (e.g., the second gate insulating layer 118) are greatest, and the modulus of elasticity, the hardness, and the layer density of the first layer (e.g., the first interlayer insulating layer 119a) of the second insulating layer (e.g., the interlayer insulating layer 119) are least. Therefore, the occurrence of cracks in the display panel may be prevented or minimized.

Figure 9:
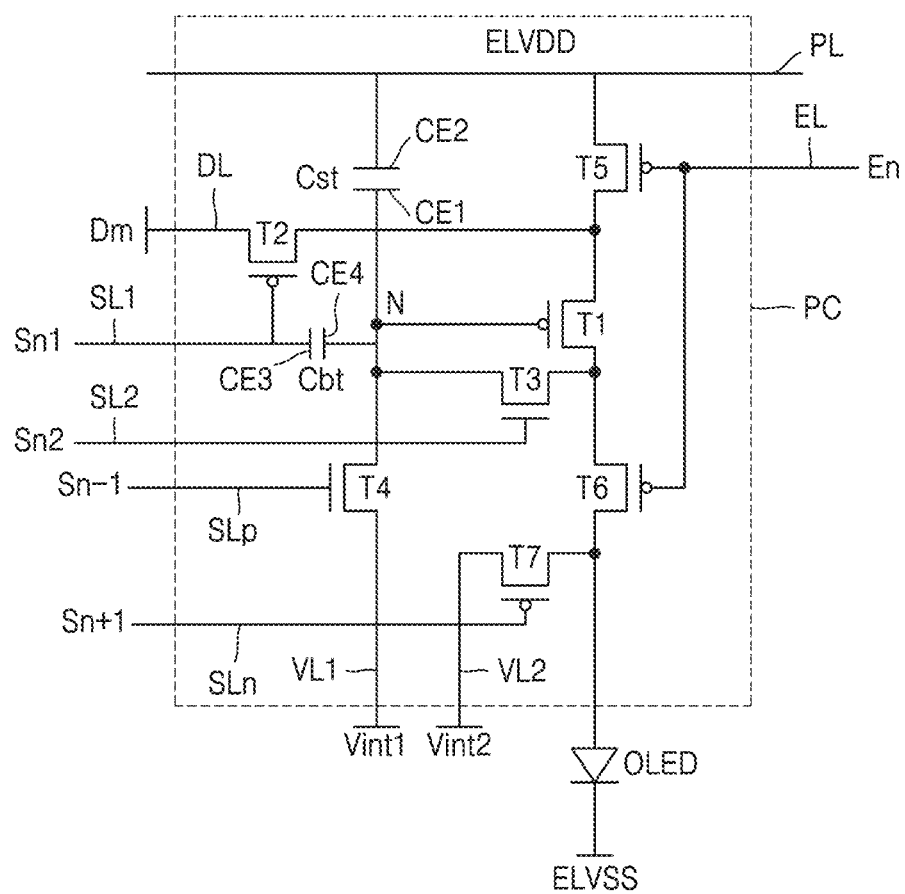
FIG. 9 is an equivalent circuit diagram of an embodiment of a pixel circuit which drives a pixel.

FIG. 9 is an equivalent circuit diagram of an embodiment of a pixel circuit PC which drives a pixel. The embodiment of FIG. 9 differs from the embodiment of FIG. 4 in that a semiconductor layer of at least one thin-film transistor includes an oxide semiconductor. In FIG. 9, the same reference numerals as those in FIG. 4 denote the same members, and redundant descriptions thereof are omitted.

Referring to FIG. 9, the pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7, a first storage capacitor Cst, and a second storage capacitor Cbt. Also, the pixel circuit PC may be connected to a plurality of signal lines, first and second initialization voltage lines VL1 and VL2, and a driving voltage line PL. The signal lines may include a data line DL, a first scan line SL1, a second scan line SL2, a previous scan line SLp, a next scan line SLn, and an emission control line EL. In an embodiment, at least one of the signal lines, the first and second initialization voltage lines VL1 and VL2, and/or the driving voltage line PL may be shared by neighboring pixel circuits, for example.

The driving voltage line PL may transmit a driving voltage (also referred to as a power supply voltage) ELVDD to the driving thin-film transistor T1. The first initialization voltage line VL1 may transmit, to the pixel circuit PC, a first initialization voltage Vint1 for initializing the driving thin-film transistor T1. The second initialization voltage line VL2 may transmit, to the pixel circuit PC, a second initialization voltage Vint2 for initializing an organic light-emitting diode OLED.

In an embodiment, the compensation thin-film transistor T3 and the first initialization thin-film transistor T4 among the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be implemented as n-channel metal-oxide semiconductor field effect transistor ("MOSFET") (hereinafter, also referred to as NMOS), and the others thereof may be implemented as p-channel MOSFET (hereinafter, also referred to as PMOS).

A drain region of the driving thin-film transistor T1 may be electrically connected to the organic light-emitting diode OLED via the emission control thin-film transistor T6. The driving thin-film transistor T1 may receive a data signal Dm according to the switching operation of the switching thin-film transistor T2 and supply a driving current to the organic light-emitting diode OLED.

The switching thin-film transistor T2 may be turned on in response to a first scan signal Sn1 received through the first scan line SL1 and perform a switching operation of transmitting, to a source region of the driving thin-film transistor T1, the data signal Dm transmitted to the data line DL.

A gate electrode of the compensation thin-film transistor T3 may be connected to the second scan line SL2. A source region of the compensation thin-film transistor T3 may be connected to the drain region of the driving thin-film transistor T1 and connected to a pixel electrode of the organic light-emitting diode OLED via the emission control thin-film transistor T6. A drain region of the compensation thin-film transistor T3 may be connected to one electrode of the first storage capacitor Cst, a source region of the first initialization thin-film transistor T4, and a gate electrode of the driving thin-film transistor T1. The compensation thin-film transistor T3 may be turned on in response to a second scan signal Sn2 received through the second scan line SL2 and connect the gate electrode and the drain region of the driving thin-film transistor T1 to each other such that the driving thin-film transistor T1 is diode-connected.

A gate electrode of the first initialization thin-film transistor T4 may be connected to the previous scan line SLp. A drain region of the first initialization thin-film transistor T4 may be connected to the first initialization voltage line VL1. The source region of the first initialization thin-film transistor T4 may be connected to one electrode of the first storage capacitor Cst, the drain region of the compensation thin-film transistor T3, and the gate electrode of the driving thin-film transistor T1. The first initialization thin-film transistor T4 may be turned on in response to a previous scan signal Sn−1 received through the previous scan line SLp and perform an initialization operation of initializing the voltage of the gate electrode of the driving thin-film transistor T1 by transmitting the first initialization voltage Vint1 to the gate electrode of the driving thin-film transistor T1.

A gate electrode of the second initialization thin-film transistor T7 may be connected to the next scan line SLn. A source region of the second initialization thin-film transistor T7 may be connected to the pixel electrode of the organic light-emitting diode OLED. A drain region of the second initialization thin-film transistor T7 may be connected to the second initialization voltage line VL2. The second initialization thin-film transistor T7 may be turned on in response to a next scan signal Sn+1 received through the next scan line SLn and initialize the pixel electrode of the organic light-emitting diode OLED.

The first storage capacitor Cst may include a first electrode CE1 and a second electrode CE2. The first electrode CE1 may be connected to the gate electrode of the driving thin-film transistor T1, and the second electrode CE2 may be connected to the driving voltage line PL. The first storage capacitor Cst may store and maintain a voltage corresponding to a difference between the voltage of the driving voltage line PL and the voltage of the gate electrode of the driving thin-film transistor T1, so that the voltage applied to the gate electrode of the driving thin-film transistor T1 is maintained.

The second storage capacitor Cbt may include a third electrode CE3 and a fourth electrode CE4. The third electrode CE3 may be connected to the first scan line SL1 and a gate electrode of the switching thin-film transistor T2. The fourth electrode CE4 may be connected to the gate electrode of the driving thin-film transistor T1 and the first electrode CE1 of the first storage capacitor Cst. The second storage capacitor Cbt is a boosting capacitor. When the first scan signal Sn1 of the first scan line SL1 is a voltage for turning off the switching thin-film transistor T2, the second storage capacitor Cbt may increase a voltage of a node N so that a voltage (black voltage) displaying black is reduced.

A predetermined operation of each pixel circuit PC in an embodiment is as follows.

During a first initialization period, when the previous scan signal Sn−1 is supplied through the previous scan line SLp, the first initialization thin-film transistor T4 may be turned on in response to the previous scan signal Sn−1, and the driving thin-film transistor T1 may be initialized by the first initialization voltage Vint1 supplied from the first initialization voltage line VL1.

During a data programming period, when the first scan signal Sn1 and the second scan signal Sn2 are respectively supplied through the first scan line SL1 and the second scan line SL2, the switching thin-film transistor T2 and the compensation thin-film transistor T3 may be turned on in response to the first scan signal Sn1 and the second scan signal Sn2. At this time, the driving thin-film transistor T1 may be diode-connected by the turned-on compensation thin-film transistor T3 and biased in the forward direction. A voltage, in which a threshold voltage (Vth) of the driving thin-film transistor T1 is compensated in the data signal Dm supplied from the data line DL, may be applied to the gate electrode of the driving thin-film transistor T1. The power supply voltage ELVDD and the compensation voltage may be applied to both ends of the first storage capacitor Cst, and electric charges corresponding to a voltage difference between both ends of the first storage capacitor Cst may be stored in the first storage capacitor Cst.

During an emission period, the operation control thin-film transistor T5 and the emission control thin-film transistor T6 may be turned on in response to the emission control signal En supplied from the emission control line EL. The driving current may be generated according to the difference between the voltage of the gate electrode of the driving thin-film transistor T1 and the power supply voltage ELVDD, and the driving current may be supplied to the organic light-emitting diode OLED through the emission control thin-film transistor T6.

During a second initialization period, when the next scan signal Sn+1 is supplied through the next scan line SLn, the second initialization thin-film transistor T7 may be turned on in response to the next scan signal Sn+1, and the organic light-emitting diode OLED may be initialized by the second initialization voltage Vint2 supplied from the second initialization voltage line VL2.

In an embodiment, at least one of the thin-film transistors T1 to T7 may include oxide-based thin-film transistors including an oxide semiconductor, and the others thereof may include silicon-based thin-film transistors including a silicon semiconductor. Specifically, the driving thin-film transistor T1 that directly influences the brightness of the display apparatus may be a silicon-based thin-film transistor including a silicon semiconductor including polycrystalline silicon with high reliability. In this manner, a high-resolution display apparatus may be implemented.

Because the oxide semiconductor has high carrier mobility and low leakage current, the voltage drop is not great even though the driving time is long. That is, even during low-frequency driving, the color change of the image according to the voltage drop is not great, and thus, low-frequency driving is possible. As such, the oxide semiconductor has the advantage of less leakage current. Therefore, at least one of the compensation thin-film transistor T3 and the first initialization thin-film transistor T4, which are connected to the gate electrode of the driving thin-film transistor T1, may include an oxide semiconductor and may prevent leakage current that may flow to the gate electrode of the driving thin-film transistor T1 and reduce power consumption.

For convenience of explanation, a case in which the driving thin-film transistor T1, the switching thin-film transistor T2, the operation control thin-film transistor T5, the emission control thin-film transistor T6, and the second initialization thin-film transistor T7 are silicon-based thin-film transistors including a silicon semiconductor and the compensation thin-film transistor T3 and the first initialization thin-film transistor T4 are oxide-based thin-film transistors including an oxide semiconductor will be described.

Figure 10:
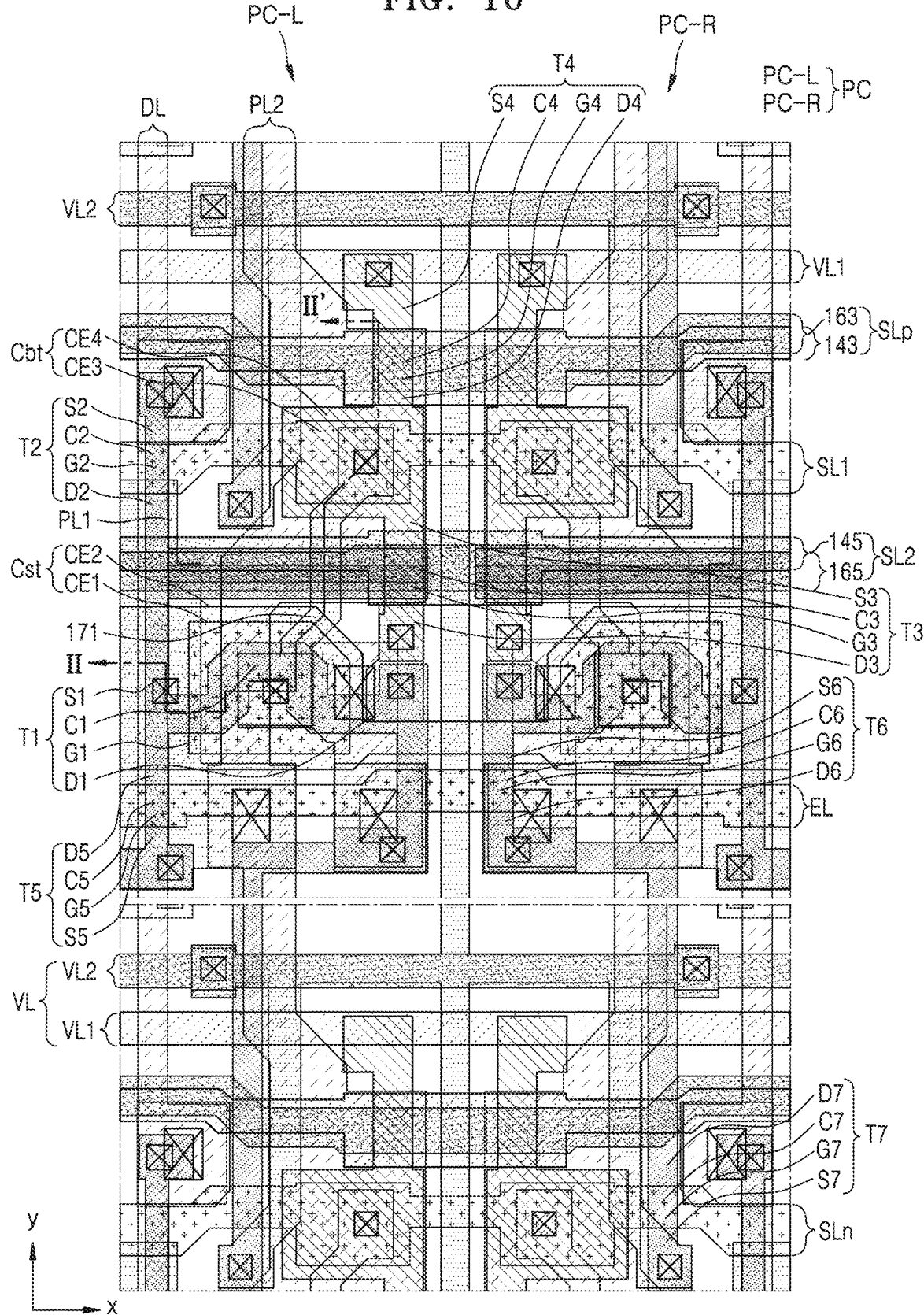
FIG. 10 is a layout diagram schematically illustrating an embodiment of a pair of pixel circuits of a display apparatus.

FIG. 10 is a layout diagram schematically illustrating an embodiment of a pair of pixel circuits of a display apparatus. The pixel circuits may be arranged in rows and columns, and FIG. 10 illustrates a pair of pixel circuits PC arranged in the same row of adjacent columns. A pixel circuit PC-L on a left side and a pixel circuit PC-R on a right side in FIG. 10 have a bilaterally symmetrical structure.

A semiconductor layer of each of a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7 may include a channel region, and a source region and a drain region on both opposite sides of the channel region. The source region and the drain region may be understood as a source electrode and a drain electrode of a corresponding thin-film transistor. The source region and the drain region may be changed with each other according to characteristics of the transistor. Hereinafter, the terms "source region" and "drain region" are used instead of the "source electrode" or the "drain electrode."

The driving thin-film transistor T1 may include a first semiconductor layer and a first gate electrode G1. The first semiconductor layer may include a first channel region C1, and a first source region S1 and a first drain region D1 on both opposite sides of the first channel region C1. The first semiconductor layer may have a curved shape, so that the first channel region C1 is longer than the other channel regions C2 to C7. In an embodiment, because the first semiconductor layer including the first channel region C1 has a shape, such as "S," "M," or "W", which is bent multiple times, a long channel length may be formed or provided in a narrow space. Because the first channel region C1 is formed or provided to be long, a driving range of a gate voltage applied to the first gate electrode G1 is widened. Therefore, a gray scale of light emitted from an organic light-emitting diode OLED may be controlled more precisely, and display quality may be improved, for example. In an embodiment, the first channel region C1 may have a linear shape rather than a bent shape. The first gate electrode G1 may have an isolated shape and overlap the first channel region C1.

A first storage capacitor Cst may overlap the driving thin-film transistor T1. The first storage capacitor Cst may include a first electrode CE1 and a second electrode CE2. The first gate electrode G1 may serve as not only the control electrode of the driving thin-film transistor T1 but also the first electrode CE1 of the first storage capacitor Cst. That is, the first gate electrode G1 may be formed or provided unitarily with the first electrode CE1. The second electrode CE2 of the first storage capacitor Cst overlaps the first electrode CE1 with an insulating layer therebetween. In this case, the insulating layer may serve as a dielectric layer of the first storage capacitor Cst.

The switching thin-film transistor T2 may include a second semiconductor layer and a second gate electrode G2. The second semiconductor layer may include a second channel region C2, and a second source region S2 and a second drain region D2 on both opposite sides of the second channel region C2. The second source region S2 may be electrically connected to a data line DL, and the second drain region D2 may be connected to the first source region S1. The second gate electrode G2 may be provided as a portion of a first scan line SL1.

The operation control thin-film transistor T5 may include a fifth semiconductor layer and a fifth gate electrode G5. The fifth semiconductor layer may include a fifth channel region C5, and a fifth source region S5 and a fifth drain region D5 on both opposite sides of the fifth channel region C5. The fifth source region S5 may be electrically connected to a first driving voltage line PL1, and the fifth drain region D5 may be connected to the first source region S1. The fifth gate electrode G5 may be provided as a portion of an emission control line EL.

The emission control thin-film transistor T6 may include a sixth semiconductor layer and a sixth gate electrode G6. The sixth semiconductor layer may include a sixth channel region C6, and a sixth source region S6 and a sixth drain region D6 on both opposite sides of the sixth channel region C6. The sixth source region S6 may be connected to the first drain region D1, and the sixth drain region D6 may be electrically connected to a pixel electrode of the organic light-emitting diode OLED. The sixth gate electrode G6 may be provided as a portion of the emission control line EL.

The second initialization thin-film transistor T7 may include a seventh semiconductor layer and a seventh gate electrode G7. The seventh semiconductor layer may include a seventh channel region C7, and a seventh source region S7 and a seventh drain region D7 on both opposite sides of the seventh channel region C7. The seventh source region S7 may be electrically connected to a second initialization voltage line VL2, and the seventh drain region D7 may be connected to the sixth drain region D6. The seventh gate electrode G7 may be provided as a portion of a next scan line SLn.

A third gate insulating layer (refer to 117 of FIG. 11) may be on the driving thin-film transistor T1, the switching thin-film transistor T2, the operation control thin-film transistor T5, and the emission control thin-film transistor T6, and the second initialization thin-film transistor T7 each including a silicon semiconductor, and the compensation thin-film transistor T3 and the first initialization thin-film transistor T4 each including an oxide semiconductor may be on the third gate insulating layer 117.

Each of the semiconductor layers of the compensation thin-film transistor T3 and the first initialization thin-film transistor T4 may include a channel region, and a source region and a drain region on both opposite sides of the channel region. In an embodiment, the source region and the drain region may be formed or provided by making the oxide semiconductor conductive by adjusting the carrier concentration thereof. In an embodiment, the source regions and the drain regions of the compensation thin-film transistor T3 and the first initialization thin-film transistor T4 may be formed or provided by increasing the carrier concentration through plasma treatment on an oxide semiconductor using hydrogen (H)-based gas, fluorine (F)-based gas, or any combinations thereof, for example. The source region and the drain region may correspond to a source electrode and a drain electrode, respectively. Hereinafter, the terms "source region" and "drain region" are used instead of the "source electrode" or the "drain electrode."

The compensation thin-film transistor T3 may include a third gate electrode G3 and a third semiconductor layer including an oxide semiconductor. The third semiconductor layer may include a third channel region C3, and a third source region S3 and a third drain region D3 on both opposite sides of the third channel region C3. The third source region S3 may be bridged to the first gate electrode G1 through a node connection line 171. Also, the third source region S3 may be connected to the fourth drain region D4 on the same layer. The third drain region D3 may be electrically connected to a first semiconductor layer A1 (refer to FIG. 11) of the driving thin-film transistor T1 and a sixth semiconductor layer of the emission control thin-film transistor T6. The third gate electrode G3 may be provided as a portion of the second scan line SL2.

The first initialization thin-film transistor T4 may include a fourth gate electrode G4 and a fourth semiconductor layer including an oxide semiconductor. The fourth semiconductor layer may include a fourth channel region C4, and a fourth source region S4 and a fourth drain region D4 on both opposite sides of the fourth channel region C4. The fourth source region S4 may be electrically connected to the first initialization voltage line VL1, and the fourth drain region D4 may be bridged to the first gate electrode G1 through the node connection line 171. The fourth gate electrode G4 may be provided as a portion of the previous scan line SLp.

A fourth gate insulating layer (refer to 118 of FIG. 11) corresponding to each channel region may be between the third semiconductor layer and the third gate electrode G3 and between the fourth semiconductor layer and the fourth gate electrode G4.

The third electrode CE3 of the second storage capacitor Cbt may be provided as a portion of the first scan line SL1 and may be connected to the second gate electrode G2 of the switching thin-film transistor T2. The fourth electrode CE4 of the second storage capacitor Cbt may overlap the third electrode CE3 and may include an oxide semiconductor. The fourth electrode CE4 may be in the same layer as the third semiconductor layer of the compensation thin-film transistor T3 and the fourth semiconductor layer of the first initialization thin-film transistor T4, and may be an area between the third semiconductor layer and the fourth semiconductor layer. In an alternative embodiment, the fourth electrode CE4 may extend from the fourth semiconductor layer. In an alternative embodiment, the fourth electrode CE4 may extend from the third semiconductor layer.

The node connection line 171 may be electrically connected to the first electrode CE1 and the third semiconductor layer of the compensation thin-film transistor T3. The second electrode CE2 may be electrically connected to the first driving voltage line PL1, and the first driving voltage line PL1 may be electrically connected to the second driving voltage line PL2. The first driving voltage line PL1 and the second driving voltage line PL2 may extend in the second direction (y direction). The second electrode CE2 may extend in the first direction (x direction) and may transmit the power supply voltage ELVDD in the first direction (x direction). Therefore, in the display area DA, a plurality of first driving voltage lines PL1 and second driving voltage lines PL2 and a plurality of second electrodes CE2 may form a mesh structure.

In an embodiment, some lines may include two conductive layers in different layers from each other. In an embodiment, the previous scan line SLp may include a lower scan line 143 and an upper scan line 163, which are in different layers from each other. The lower scan line 143 may include the same material as that of the second electrode CE2 of the first storage capacitor Cst and may be in the same layer as the second electrode CE2 of the first storage capacitor Cst, for example. The lower scan line 143 may be arranged to overlap at least a portion of the upper scan line 163. Because the lower scan line 143 and the upper scan line 163 correspond to a portion of the third gate electrode G3 of the compensation thin-film transistor T3, the compensation thin-film transistor T3 may have a double gate structure including control electrodes below and above the semiconductor layer.

Also, the second scan line SL2 may include a lower scan line 145 and an upper scan line 165, which are in different layers from each other. The lower scan line 145 may include the same material as that of the second electrode CE2 of the first storage capacitor Cst and may be in the same layer as the second electrode CE2 of the first storage capacitor Cst. The lower scan line 145 may be arranged to overlap at least a portion of the upper scan line 165. Because the lower scan line 145 and the upper scan line 165 correspond to a portion of the fourth gate electrode G4 of the first initialization thin-film transistor T4, the first initialization thin-film transistor T4 may have a double gate structure including control electrodes below and above the semiconductor layer. In an embodiment, the initialization voltage line VL may include a first initialization voltage line VL1 and a second initialization voltage line VL2, which are in different layers from each other, for example.

The first initialization voltage line VL1 may include the same material as that of the second electrode CE2 of the first storage capacitor Cst and may be in the same layer as the second electrode CE2 of the first storage capacitor Cst. The second initialization voltage line VL2 may include the same material as that of the first driving voltage line PL1 and may be in the same layer as the first driving voltage line PL1.

Figure 11:
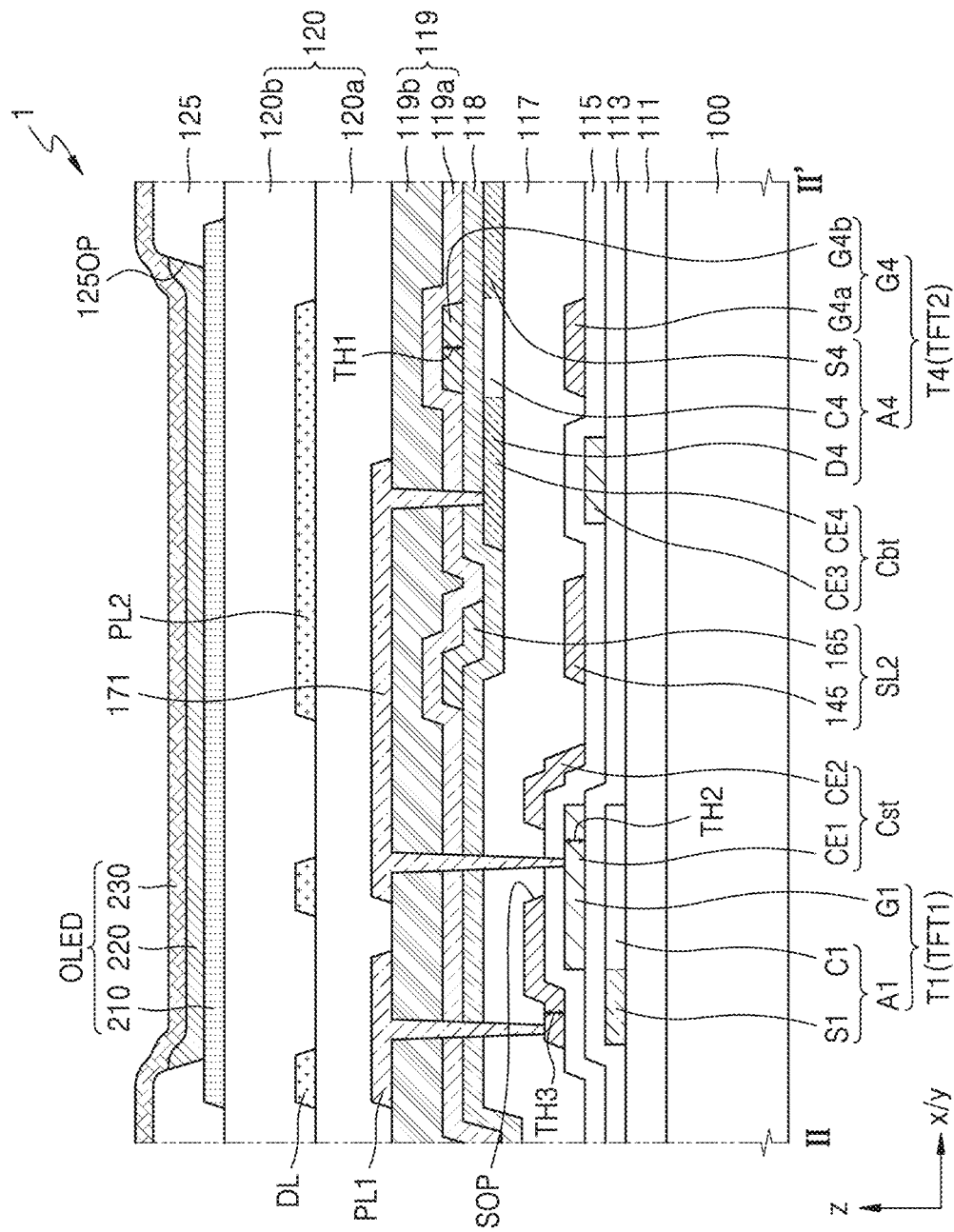
FIG. 11 is a cross-sectional view schematically illustrating an embodiment of a display apparatus.

FIG. 11 is a cross-sectional view schematically illustrating an embodiment of a display apparatus 1. FIG. 11 corresponds to a cross-sectional view of the display apparatus 1 taken along line II-II' of FIG. 10. The embodiment of FIG. 11 differs from the embodiment of FIG. 6 in that a semiconductor layer of at least one thin-film transistor includes an oxide semiconductor. In FIG. 11, the same reference numerals as those in FIG. 6 denote the same members, and redundant descriptions thereof are omitted.

In FIG. 11, for convenience of explanation, the driving thin-film transistor T1 and the first initialization thin-film transistor T4 will be mainly described. The stack structure of the switching thin-film transistor T2, the operation control thin-film transistor T5, the emission control thin-film transistor T6, and the second initialization thin-film transistor T7 may be the same as or similar to the driving thin-film transistor T1, and the stack structure of the compensation thin-film transistor T3 may be the same as or similar to the first initialization thin-film transistor T4.

Referring to FIG. 11, the display apparatus 1 may include a substrate 100. A buffer layer 111 may be on the substrate 100. A driving thin-film transistor T1 (e.g., a first thin-film transistor TFT1) and a first storage capacitor Cst may be on the buffer layer 111. The first thin-film transistor TFT1 may include a first semiconductor layer A1 and a first gate electrode G1. The first storage capacitor Cst may include a first electrode CE1 and a second electrode CE2.

Semiconductor layers of the driving thin-film transistor T1, the switching thin-film transistor T2, the operation control thin-film transistor T5, the emission control thin-film transistor T6, and the second initialization thin-film transistor T7 may be on the buffer layer 111. The first semiconductor layer A1 of the driving thin-film transistor T1, which is a portion of the semiconductor layer, is illustrated in FIG. 11.

In an embodiment, the first semiconductor layer A1 may be on the buffer layer 111 and may include polysilicon. In an embodiment, the first semiconductor layer A1 may include amorphous silicon. The first semiconductor layer A1 may include a first channel region C1 and a first source region S1 doped with impurities.

A first gate insulating layer 113 may cover the first semiconductor layer A1.

Gate electrodes of the driving thin-film transistor T1, the switching thin-film transistor T2, the operation control thin-film transistor T5, the emission control thin-film transistor T6, and the second initialization thin-film transistor T7 may be on the first gate insulating layer 113. The first gate electrode G1 of the driving thin-film transistor T1 is illustrated in FIG. 11. Also, the third electrode CE3 of the second storage capacitor Cbt and the emission control line (refer to EL of FIG. 10) may be on the first gate insulating layer 113.

The first gate electrode G1 may be on the first gate insulating layer 113 to overlap the first semiconductor layer A1. The first gate electrode G1 may include molybdenum (Mo), aluminum (Al), copper (Cu), titanium (Ti), and the like, and may include a single layer or multiple layers. In an embodiment, the first gate electrode G1 may include a single molybdenum (Mo) layer.

A second gate insulating layer 115 may cover the first gate electrode GE1. In an embodiment, the second gate insulating layer 115 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The second gate insulating layer 115 may include a single layer or multiple layers including the above-described inorganic insulating material.

The second electrode CE2 of the first storage capacitor Cst may be on the second gate insulating layer 115. The second electrode CE2 may overlap the first gate electrode G1 therebelow. The first gate electrode G1 and the second electrode CE2 overlapping each other with the second gate insulating layer 115 therebetween may constitute the first storage capacitor Cst. In an embodiment, the first gate electrode G1 may be the first electrode CE1 of the first storage capacitor Cst. In an embodiment, the first electrode CE1 of the first storage capacitor Cst may be provided as a separate and independent element.

The second electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the above-described material. In an embodiment, the second electrode CE2 may include molybdenum (Mo), for example.

In an embodiment, an opening SOP may be defined in the second electrode CE2. The opening SOP may be formed or provided by removing a portion of the second electrode CE2 and may have a closed shape.

The first initialization voltage line (refer to VL1 of FIG. 10), the lower scan line (refer to 143 of FIG. 10) of the previous scan line (refer to SLp of FIG. 10), and the lower scan line (refer to 145 of FIG. 10) of the second scan line SL2 may be on the second gate insulating layer 115, and may include the same material as that of the second electrode CE2 of the first storage capacitor Cst. A portion of the lower scan line 143 of the previous scan line SLp overlapping the second semiconductor layer may be a lower gate electrode G4a of the first initialization thin-film transistor T4 (e.g., the second thin-film transistor TFT2).

A third gate insulating layer 117 may cover the second electrode CE2. In an embodiment, the third gate insulating layer 117 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The third gate insulating layer 117 may include a single layer or multiple layers including the above-described inorganic insulating material.

The first initialization thin-film transistor T4 (e.g., the second thin-film transistor TFT2) may be on the third gate insulating layer 117. The second thin-film transistor TFT2 may include a fourth semiconductor layer A4 and an upper gate electrode G4b (e.g., a second gate electrode).

An oxide semiconductor layer may be on the third gate insulating layer 117. The oxide semiconductor layer may include Zn oxide, In—Zn oxide, Ga—In—Zn oxide, and the like as a Zn oxide-based material. In an embodiment, the oxide-based semiconductor layer may include In-Ga—Zn-O ("IGZO"), In—Sn—Zn—O ("ITZO"), or In—Ga—Sn—Zn—O ("IGTZO") semiconductor, in which a metal such as indium (In), gallium (Ga), and tin (Sn) is included in ZnO.

The oxide semiconductor layer may include a channel region, a source region, and a drain region of each of the compensation thin-film transistor T3 and the first initialization thin-film transistor T4. The fourth semiconductor layer A4 of the first initialization thin-film transistor T4 is illustrated in FIG. 11.

The oxide semiconductor layer may include the fourth electrode CE4 of the second storage capacitor Cbt. In an embodiment, the fourth electrode CE4 may be provided as a portion of the fourth semiconductor layer A4 of the first initialization thin-film transistor T4, for example. A second gate insulating layer 115 and a third gate insulating layer 117 may be between the third electrode CE3 and the fourth electrode CE4 of the second storage capacitor Cbt. The second gate insulating layer 115 and the third gate insulating layer 117 may function as dielectric layers of the second storage capacitor Cbt.

An upper gate electrode G4b of the first initialization thin-film transistor T4 may be on the oxide semiconductor layer. The upper gate electrode G4b of the first initialization thin-film transistor T4 may be a portion of the upper scan line (refer to 163 of FIG. 10) of the previous scan line (refer to SLp of FIG. 10) overlapping the fourth semiconductor layer A4. That is, the first initialization thin-film transistor T4 may have a double gate structure including control electrodes above and below the semiconductor layer. The upper gate electrode G4b of the first initialization thin-film transistor T4 may be on the fourth gate insulating layer 118. The upper gate electrode G4b of the first initialization thin-film transistor T4 may include at least one of molybdenum (Mo), copper (Cu), and titanium (Ti) and may include a single layer or multiple layers.

The fourth gate insulating layer 118 may include an inorganic material including an oxide or a nitride. In an embodiment, the fourth gate insulating layer 118 may include at least one of silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide (ZnO), for example. In an embodiment, the fourth gate insulating layer 118 may include silicon nitride ($SiN_x$).

The second initialization voltage line (refer to VL2 of FIG. 10), the upper scan line (refer to 163 of FIG. 10) of the previous scan line (refer to SLp of FIG. 10), and the upper scan line 165 of the second scan line SL2 may be on the fourth gate insulating layer 118.

In an embodiment, the fourth gate insulating layer 118 may be provided unitarily. In an embodiment, the fourth gate insulating layer 118 may be patterned to correspond to the second initialization voltage line (refer to VL2 of FIG. 10), the upper scan line (refer to 163 of FIG. 10) of the previous scan line (refer to SLp of FIG. 10), and the upper scan line 165 of the second scan line SL2, which are on the fourth gate insulating layer 118.

An interlayer insulating layer 119 may be provided to cover the second initialization voltage line (refer to VL2 of FIG. 10), the upper scan line (refer to 163 of FIG. 10) of the previous scan line (refer to SLp of FIG. 10), and the upper scan line 165 of the second scan line SL2. In an embodiment, the interlayer insulating layer 119 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 119 may include a single layer or multiple layers including the above-described inorganic insulating material.

In an embodiment, the interlayer insulating layer 119 may include a first interlayer insulating layer 119a and a second interlayer insulating layer 119b. In an embodiment, the interlayer insulating layer 119 may include the first interlayer insulating layer 119a on the second initialization voltage line (refer to VL2 of FIG. 10), the upper scan line (refer to 163 of FIG. 10) of the previous scan line (refer to SLp of FIG. 10), and the upper scan line 165 of the second scan line SL2, and the second interlayer insulating layer 119b on the first interlayer insulating layer 119a. In an embodiment, the first interlayer insulating layer 119a and the second interlayer insulating layer 119b may include the same material as each other. In an embodiment, both the first interlayer insulating layer 119a and the second interlayer insulating layer 119b may include silicon oxide ($SiO_x$), or both the first interlayer insulating layer 119a and the second interlayer insulating layer 119b may include silicon nitride ($SiN_x$), for example. In an embodiment, the first interlayer insulating layer 119a and the second interlayer insulating layer 119b may include different materials from each other. In an embodiment, the first interlayer insulating layer 119a may include silicon oxide ($SiO_x$), and the second interlayer insulating layer 119b may include silicon nitride ($SiN_x$), for example. Also, on the contrary, the first interlayer insulating layer 119a may include silicon nitride ($SiN_x$), and the second interlayer insulating layer 119b may include silicon oxide ($SiO_x$).

A first driving voltage line PL1 and a node connection line 171 may be on the interlayer insulating layer 119. In an embodiment, the first driving voltage line PL1 and the node connection line 171 may include a material having high conductivity, such as a metal or a conductive oxide. In an embodiment, the first driving voltage line PL1 and the node connection line 171 may include a single layer or multiple layers including at least one of aluminum (Al), copper (Cu), and titanium (Ti), for example.

The first driving voltage line PL1 may be connected to the second electrode CE2 of the first storage capacitor Cst through contact holes defined in the third gate insulating layer 117, the fourth gate insulating layer 118, and the interlayer insulating layer 119.

One end of the node connection line 171 may be connected to the first gate electrode G1 through contact holes passing through the interlayer insulating layer 119, the fourth gate insulating layer 118, the third gate insulating layer 117, and the second gate insulating layer 115. The other end of the node connection line 171 may be connected to the oxide semiconductor layer, for example, the fourth electrode CE4 or the fourth semiconductor layer A4 of the second storage capacitor Cbt through a contact hole passing through the interlayer insulating layer 119.

The fourth electrode CE4 of the second storage capacitor Cbt may be connected to the node connection line 171 and electrically connected to the first gate electrode G1. Therefore, when the first scan signal Sn1 supplied to the first scan line SL1 is turned off, the second storage capacitor Cbt may increase the voltage of the node (refer to N of FIG. 10), so that the black gray scale is clearly expressed.

A planarization layer 120 may be provided to cover the first driving voltage line PL1 and the node connection line 171. The planarization layer 120 may have a flat upper surface so that a pixel electrode 210 arranged thereon may be formed or provided to be flat.

The planarization layer 120 may include a first planarization layer 120a and a second planarization layer 120b. The first planarization layer 120a may be on the first driving voltage line PL1 and the node connection line 171, the data line DL and the second driving voltage line PL2 may be on the first planarization layer 120a, and the second planarization layer 120b may be on the data line DL and the second driving voltage line P L2.

An organic light-emitting diode OLED including a pixel electrode 210, an intermediate layer 220, and an opposite electrode 230 may be on the planarization layer 120. A pixel defining layer 125 may be on the planarization layer 120. The pixel defining layer 125 may be on the planarization layer 120 and may cover edges of the pixel electrode 210. An opening 1250P exposing at least a portion of the pixel electrode 210 may be defined in the pixel defining layer 125.

In an embodiment, a first insulating layer may be on the substrate 100. In an embodiment, the first insulating layer may be the fourth gate insulating layer 118 described above. The first insulating layer may include silicon oxide ($SiO_x$), for example.

In an embodiment, first metal layers may be on the first insulating layer (e.g., the fourth gate insulating layer 118). The first metal layers may refer to layers on the first insulating layer (e.g., the fourth gate insulating layer 118). In an embodiment, the first metal layers may include at least one of the upper gate electrode G4b of the first initialization thin-film transistor T4, the second initialization voltage line (refer to VL2 of FIG. 10), the upper scan line (refer to 163 of FIG. 10) of the previous scan line (refer to SLp of FIG. 10), and the upper scan line 165 of the second scan line SL2, which are on the first insulating layer (e.g., the fourth gate insulating layer 118), for example. Also, when the data line DL and/or the first and second driving voltage lines PL1 and PL2 are on the first insulating layer (e.g., the fourth gate insulating layer 118), the first metal layers may include at least one of the data line DL and/or the first and second driving voltage lines PL1 and PL2.

In an embodiment, a second insulating layer may be on the first metal layers. In an embodiment, the second insulating layer may be the above-described interlayer insulating layer 119, for example. The second insulating layer may include a first layer and a second layer including a material different from that of the first layer. In an embodiment, the first layer of the second insulating layer may be the first interlayer insulating layer 119a, and the second layer of the second insulating layer may be the second interlayer insulating layer 119b, for example. The first layer (e.g., the first interlayer insulating layer 119a) may include silicon oxide ($SiO_x$), and the second layer (e.g., the second interlayer insulating layer 119b) may include silicon nitride ($SiN_x$). Also, on the contrary, the first layer (e.g., the first interlayer insulating layer 119a) may include silicon nitride ($SiN_x$), and the second layer (e.g., the second interlayer insulating layer 119b) may include silicon oxide ($SiO_x$).

In an embodiment, second metal layers may be between the substrate 100 and the first insulating layer (e.g., the fourth gate insulating layer 118). The second metal layers may refer to layers on the first gate insulating layer 113. In an embodiment, the second metal layers may include at least one of the first, second, fifth, sixth, and seventh gate electrodes G1, G2, G5, G6, and G7, the third electrode CE3 of the second storage capacitor Cbt, and the emission control line EL, which are on the first gate insulating layer 113, for example. In an alternative embodiment, when the first scan line SL1, the previous scan line SLp, and/or the next scan line SLn are on the first gate insulating layer 113, the second metal layers may include at least one of the first scan line SL1, the previous scan line SLp, and/or the next scan line SLn.

In an embodiment, third metal layers may be between the first metal layers (e.g., layers on the fourth gate insulating layer 118) and the second metal layers (e.g., layers on the first gate insulating layer 113). The third metal layers may refer to layers on the second gate insulating layer 115. In an embodiment, the third metal layers may include at least one of the second electrode CE2 of the first storage capacitor Cst, the first initialization voltage line (refer to VL1 of FIG. 10), the lower scan line (refer to 143 of FIG. 10) of the previous scan line (refer to SLp of FIG. 10), and the lower scan line (refer to 145 of FIG. 10) of the second scan line SL2, which are on the second gate insulating layer 115, for example. In an alternative embodiment, when the first scan line SL1, the previous scan line SLp, and/or the next scan line SLn are on the second gate insulating layer 115, the third metal layers may include at least one of the first scan line SL1, the previous scan line SLp, and/or the next scan line SLn.

In an embodiment, the first metal layers on the first insulating layer (e.g., the fourth gate insulating layer 118) may have a first thickness (e.g., TH1 in FIG. 11). In this case, the first thickness may be about 2,200 Å to about 2,300 Å. When the first metal layers have a thickness of less than 2,200 Å, problems such as an abnormal luminance, an increase in crosstalk, and an increase in the level of spots may occur due to the SOT delay. When the first metal layers have a thickness of greater than 2,300 Å, the tensile stress of the first metal layers may increase. Therefore, the first metal layers may have a thickness of about 2,200 Å to about 2,300 Å, so that the reliability of the display panel 10 may be improved and the first metal layers may have a low tensile stress or compressive stress.

In an embodiment, the metal layers (e.g., the first metal layers) on the first insulating layer (e.g., the fourth gate insulating layer 118) may have a compressive stress or a tensile stress of about 100 MPa or less. In an embodiment, because the metal layers (e.g., the first metal layers) have a compressive stress or a tensile stress of about 100 MPa or less, the layer density of the metal layers (e.g., the first metal layers) may increase and the grain size of the metal layers (e.g., the first metal layers) may decrease.

Because the metal layers (e.g., the first metal layers) have a compressive stress or a tensile stress of about 100 MPa or less, the strain of the insulating layers above and/or below the metal layers (e.g., the first metal layers) may decrease, and thus, the occurrence of cracks in the insulating layer may be prevented or minimized. Also, the impact resistance of the display panel 10 may be improved by reducing the difference in stress between the metal layers (e.g., the first metal layers) and the insulating layer.

A stress deviation of the metal layers (e.g., the first metal layers) on the insulating layer (e.g., the fourth gate insulating layer 118) may be about 100 MPa or less. Specifically, the difference between the stress of the metal layer having the greatest stress and the stress of the metal layer having the least stress among the metal layers (e.g., the first metal layers) on the insulating layer (e.g., the fourth gate insulating layer 118) may be about 100 MPa or less. In an embodiment, the stress deviation between the metal layers (e.g., the first metal layers) in the portion (refer to B of FIG. 8) adjacent to the corner portion (refer to C of FIG. 8) of the display panel 10 and the metal layers (e.g., the first metal layers) in the central portion (refer to A of FIG. 8) of the display panel 10 may be about 100 MPa or less, for example. Therefore, the metal layers (e.g., the first metal layers) in the portion B adjacent to the corner portion C of the display panel 10 and the metal layers (e.g., the first metal layers) in the central portion A of the display panel 10 may have similar stresses to each other. Because the stress deviation of the metal layers (e.g., the first metal layers) on the insulating layer (e.g., the first insulating layer) is about 100 MPa or less, the portion B adjacent to the corner portion C of the display panel 10 and the central portion A of the display panel 10 have similar impact resistances to each other, and thus, the impact resistance dispersion of the display panel 10 may be reduced. In an embodiment, the impact resistance dispersion between the portion B adjacent to the corner portion C of the display panel 10 and the central portion A of the display panel 10 may be about 1 cm or less, for example. That is, the impact resistance dispersion of the display panel 10 may be reduced. Also, the portion B adjacent to the corner portion C of the display panel 10 and the central portion A of the display panel 10 may all have an impact resistance dispersion of about 7 cm or more.

In an embodiment, the second metal layers may have a second thickness (e.g., TH2 in FIG. 11). In this case, the second thickness may be about 2,000 Å to about 2,100 Å. When the second metal layers have a thickness of less than 2,000 Å, problems such as an abnormal luminance, an increase in crosstalk, and an increase in the level of spots may occur due to the SOT delay. When the second metal layers have a thickness of more than 2,100 Å, the tensile stress of the second metal layers may increase. Therefore, the second metal layers may have a thickness of about 2,000 Å to about 2,100 Å, so that the reliability of the display panel 10 may be improved and the second metal layers may have a low tensile stress or compressive stress.

In an embodiment, the metal layers (e.g., the second metal layers) may have a compressive stress or a tensile stress of about 100 MPa or less. In an embodiment, because the metal layers (e.g., the second metal layers) have a compressive stress or a tensile stress of about 100 MPa or less, the layer density of the metal layers (e.g., the second metal layers) may increase and the grain size of the metal layers (e.g., the second metal layers) may decrease.

Because the metal layers (e.g., the second metal layers) have a compressive stress or a tensile stress of about 100 MPa or less, the strain of the insulating layers above and/or below the metal layers (e.g., the second metal layers) may decrease, and thus, the occurrence of cracks in the insulating layer may be prevented or minimized. Also, the impact resistance of the display panel 10 may be improved by reducing the difference in stress between the metal layers (e.g., the second metal layers) and the insulating layer.

A stress deviation of the metal layers (e.g., the second metal layers) on the insulating layer may be about 100 MPa or less. Specifically, the difference between the stress of the metal layer having the greatest stress and the stress of the metal layer having the least stress among the metal layers (e.g., the second metal layers) on the insulating layer (e.g., the first gate insulating layer 113) may be about 100 MPa or less. In an embodiment, the stress deviation between the metal layers (e.g., the second metal layers) in the portion B adjacent to the corner portion C of the display panel 10 and the metal layers (e.g., the second metal layers) in the central portion A of the display panel 10 may be about 100 MPa or less, for example. Therefore, the metal layers (e.g., the second metal layers) in the portion B adjacent to the corner portion C of the display panel 10 and the metal layers (e.g., the second metal layers) in the central portion A of the display panel 10 may have similar stresses to each other. Because the stress deviation of the metal layers (e.g., the second metal layers) on the insulating layer (e.g., the first gate insulating layer 113) is about 100 MPa or less, the portion B adjacent to the corner portion C of the display panel 10 and the central portion A of the display panel 10 have similar impact resistances to each other, and thus, the impact resistance dispersion of the display panel 10 may be reduced. In an embodiment, the impact resistance dispersion between the portion B adjacent to the corner portion C of the display panel 10 and the central portion A of the display panel 10 may be about 1 cm or less, for example. Also, the portion B adjacent to the corner portion C of the display panel 10 and the central portion A of the display panel 10 may all have an impact resistance dispersion of about 7 cm or more.

In an embodiment, the third metal layers may have a third thickness (e.g., TH3 in FIG. 11). In this case, the third thickness may be about 2,000 Å to about 2,100 Å. When the third metal layers have a thickness of less than 2,000 Å, problems such as an abnormal luminance, an increase in crosstalk, and an increase in the level of spots may occur due to the SOT delay. When the third metal layers have a thickness of greater than 2,100 Å, the tensile stress of the third metal layers may increase. Therefore, the third metal layers may have a thickness of about 2,000 Å to about 2,100 Å, so that the reliability of the display panel 10 may be improved and the third metal layers may have a low tensile stress or compressive stress.

In an embodiment, the metal layers (e.g., the third metal layers) may have a compressive stress or a tensile stress of about 100 MPa or less. In an embodiment, because the metal layers (e.g., the third metal layers) have a compressive stress or a tensile stress of about 100 MPa or less, the layer density of the metal layers (e.g., the third metal layers) may increase and the grain size of the metal layers (e.g., the third metal layers) may decrease.

Because the metal layers (e.g., the third metal layers) have a compressive stress or a tensile stress of about 100 MPa or less, the strain of the insulating layers above and/or below the metal layers (e.g., the third metal layers) may decrease, and thus, the occurrence of cracks in the insulating layer may be prevented or minimized. Also, the impact resistance of the display panel 10 may be improved by reducing the difference in stress between the metal layers (e.g., the third metal layers) and the insulating layer.

A stress deviation of the metal layers (e.g., the third metal layers) on the insulating layer may be about 100 MPa or less. Specifically, the difference between the stress of the metal layer having the greatest stress and the stress of the metal layer having the least stress among the metal layers (e.g., the third metal layers) on the insulating layer (e.g., the second gate insulating layer 115) may be about 100 MPa or less. Specifically, the stress deviation between the metal layers (e.g., the third metal layers) in the portion B adjacent to the corner portion C of the display panel 10 and the metal layers (e.g., the third metal layers) in the central portion A of the display panel 10 may be about 100 MPa or less. Therefore, the metal layers (e.g., the third metal layers) in the portion B adjacent to the corner portion C of the display panel 10 and the metal layers (e.g., the third metal layers) in the central portion A of the display panel 10 may have similar stresses to each other. Because the stress deviation of the metal layers (e.g., the third metal layers) on the insulating layer is about 100 MPa or less, the portion B adjacent to the corner portion C of the display panel 10 and the central portion A of the display panel 10 have similar impact resistances to each other, and thus, the impact resistance dispersion of the display panel 10 may be reduced. In an embodiment, the impact resistance dispersion between the portion B adjacent to the corner portion C of the display panel 10 and the central portion A of the display panel 10 may be about 1 cm or less, for example. Also, the portion B adjacent to the corner portion C of the display panel 10 and the central portion A of the display panel 10 may all have an impact resistance dispersion of about 7 cm or more.

In an embodiment, electrodes and/or lines on the first insulating layer (e.g., the fourth gate insulating layer 118) may be the first metal layers. That is, the first metal layers may refer to at least one electrode and/or line on the first insulating layer (e.g., the fourth gate insulating layer 118).

In an embodiment, electrodes and/or lines on the third insulating layer (e.g., the first gate insulating layer 113) may be the second metal layers. That is, the second metal layers may refer to at least one electrode and/or line on the third insulating layer (e.g., the first gate insulating layer 113).

In an embodiment, electrodes and/or lines on the fourth insulating layer (e.g., the second gate insulating layer 115) may be the third metal layers. That is, the third metal layers may refer to at least one electrode and/or line on the fourth insulating layer (e.g., the second gate insulating layer 115).

In an embodiment, the metal layer has a compressive stress or a tensile stress of about 100 MPa or less, such that the formation of cracks in the metal layer and/or the insulating layers above and below the metal layer may be prevented or minimized. The scope of the invention is not limited by such an effect.

It should be understood that embodiments described herein should be considered in a descriptive sense only and not for purposes of limitation. Descriptions of features or features within each embodiment should typically be considered as available for other similar features or features in other embodiments. While one or more embodiments have been described with reference to the drawing figures, it will be understood by those of ordinary skill in the art that various changes in form and details may be made therein without departing from the spirit and scope of the invention.

What is claimed is:

1. A display apparatus comprising:
   a substrate;
   a first insulating layer on the substrate;
   first metal layers on the first insulating layer and having a stress range between a compressive stress of about −700 megapascals (MPa) and a tensile stress of about 100 megapascals (MPa);
   a second insulating layer on the first metal layers, the second insulating layer comprising:
     a first layer covering the first metal layers; and
     a second layer including a material different from a material of the first layer;
   second metal layers between the substrate and the first insulating layer;
   a first thin-film transistor on the substrate, the first thin-film transistor comprising:
     a first semiconductor layer including an oxide semiconductor; and
     a first gate electrode insulated from the first semiconductor layer; and
   a storage capacitor comprising a first electrode and a second electrode insulated from the first electrode,
   wherein the second metal layers are in a same layer as the first gate electrode.

2. The display apparatus of claim 1, wherein a stress deviation of the first metal layers is about 100 megapascals (MPa) or less.

3. The display apparatus of claim 2, wherein the first metal layers have a thickness of about 2,000 angstroms (Å) to about 2,100 angstroms (Å) in a direction perpendicular to a main plane extension direction of the substrate.

4. The display apparatus of claim 1, wherein the second metal layers have a stress range between a compressive stress of about −700 megapascals (MPa) ands a tensile stress of about 100 megapascals (MPa), or less.

5. The display apparatus of claim 1, wherein a stress deviation of the second metal layers is about 100 megapascals (MPa) or less.

6. The display apparatus of claim 1, wherein the second metal layers have a thickness of about 2,000 angstroms (Å) to about 2,100 angstroms (Å) in a direction perpendicular to a main plane extension direction of the substrate.

7. The display apparatus of claim 1, wherein the first metal layers are in a same layer as the second electrode.

8. The display apparatus of claim 1, further comprising third metal layers between the first metal layers and the second metal layers.

9. The display apparatus of claim 8, wherein the third metal layers have a stress range between a compressive stress of about −700 megapascals (MPa) and or a tensile stress of about 100 megapascals (MPa).

10. The display apparatus of claim 8, wherein a stress deviation of the third metal layers is about 100 megapascals (MPa) or less.

11. The display apparatus of claim 8, wherein the third metal layers have a thickness of about 2,000 angstroms (Å) to about 2,100 angstroms (Å) in a direction perpendicular to a main plane extension direction of the substrate.

12. The display apparatus of claim 8, wherein the first metal layers have a thickness of about 2,200 angstroms (Å) to about 2,300 angstroms (Å) in a direction perpendicular to a main plane extension direction of the substrate.

13. The display apparatus of claim 1, further comprising a second thin-film transistor comprising a second semiconductor layer including an oxide semiconductor, and a second gate electrode insulated from the second semiconductor layer.

14. The display apparatus of claim 13, wherein the first insulating layer covers the second semiconductor layer.

15. The display apparatus of claim 13, wherein the first metal layers are in a same layer as the second gate electrode.

16. The display apparatus of claim 1, wherein a modulus of elasticity of the first insulating layer is greater than a modulus of elasticity of the second layer, and the modulus of elasticity of the second layer is greater than a modulus of elasticity of the first layer.

17. The display apparatus of claim 1, wherein a hardness of the first insulating layer is greater than a hardness of the second layer, and the hardness of the second layer is greater than a hardness of the first layer.

* * * * *